United States Patent [19]
Ohta

[11] Patent Number: 6,064,093
[45] Date of Patent: May 16, 2000

[54] PROTECTION CIRCUIT WITH CLAMPING FEATURE FOR SEMICONDUCTOR DEVICE

[75] Inventor: Makoto Ohta, Tokyo, Japan

[73] Assignee: Citizen Watch Co., Ltd., Tokyo, Japan

[21] Appl. No.: 08/827,503

[22] Filed: Mar. 28, 1997

[30] Foreign Application Priority Data

Mar. 29, 1996 [JP] Japan ................................. 8-075496

[51] Int. Cl.[7] .............................. H01L 23/62; H02H 3/20
[52] U.S. Cl. ......................... 257/355; 257/360; 257/363; 361/91
[58] Field of Search ................................. 257/546, 355, 257/356, 357, 358, 359, 360, 363, 409; 361/91

[56] References Cited

U.S. PATENT DOCUMENTS

| 4,736,271 | 4/1988 | Mack et al. ............................... 361/91 |
| 4,858,055 | 8/1989 | Okitaka .................................... 257/360 |
| 5,047,820 | 9/1991 | Garnett .................................... 257/409 |

*Primary Examiner*—Steven N. Loke
*Attorney, Agent, or Firm*—Armstrong, Westerman, Hattori, McLeland & Naughton

[57] ABSTRACT

In order to protect an internal circuit from high voltages caused by static electricity applied to a pad of a semiconductor device, a protection circuit is configured of a clamping circuit portion (6) utilizing a MISFET (5) connected between the pad (10) and the internal circuit (3) and a gate circuit portion (8) connected to the clamping circuit portion (6). The source and bulk terminals of the MISFET (5) of the clamping circuit portion (6) are connected to the pad (10) and the internal circuit (3), the drain thereof is connected to a first power supply terminal (11), the gate thereof is connected to one terminal of a gate circuit resistor (15) and one terminal of a capacitor (16) constituting the gate circuit portion (8), the other terminal of the gate circuit resistor (15) is connected to a second power supply terminal (12), and the other terminal of the capacitor (16) is connected to the first power supply terminal (11). As a result, surge voltages of positive and negative polarity caused by static electricity can be clamped at a low voltage by a single clamping element (MISFET) per pad.

6 Claims, 20 Drawing Sheets

FIG. 14

PROTECTION CIRCUIT WITH CLAMPING FEATURE FOR SEMICONDUCTOR DEVICE

BACKGROUND OF THE INVENTION

1. Field of the Invention

This invention relates to a protection circuit for a semiconductor device such as a semiconductor integrated circuit (IC, LSI etc.), more particularly to a protection circuit provided in such a semiconductor device for protecting an internal circuit from high-surge voltages, such as those generated by static electricity, accidentally applied to a pad serving as a terminal for connection with an external circuit.

2. Description of the Related Art

Variously configured protection circuits are used to protect the internal circuitry of semiconductor devices from high-surge voltages, such as those generated by static electricity. One example is shown in FIG. 24.

FIG. 24 is a circuit diagram showing an example of the input circuit of a semiconductor device equipped with an ordinary protection circuit 9 and an internal circuit 3.

The protection circuit 9 is constituted of diodes 91, 92 and a resistor 4, while the internal circuit 3 is constituted of a P-channel metal-insulator-semiconductor (MIS) field effect transistor 1 and an N-channel MIS field effect transistor 2.

"MIS field effect transistor" is a general term encompassing field effect transistors of the metal-insulator-semiconductor structure, including MOS field effect transistors. It is abbreviated as MISFET in this specification.

In the input circuit of this semiconductor device, a pad 10 is connected to the anode of the diode 91 and one terminal of the resistor 4 constituting the protection circuit 9. The other terminal of the resistor 4 is connected to the cathode of the diode 92 and the gates of the P-channel MISFET 1 and the N-channel MISFET 2 constituting the internal circuit 3.

A first power supply terminal 11 is connected to one terminal of the P-channel MISFET 1 and the cathode of the diode 91, and a second power supply terminal 12 is connected to the other terminal of the N-channel MISFET 2 and the anode of the diode 92.

The first power supply terminal 11 is supplied with a base voltage (VDD) and the second power supply terminal 12 is supplied with a negative supply voltage (VSS).

The other terminal of the P-channel MISFET I and the other terminal of the N-channel MISFET 2 are both connected to an output terminal 13.

The protection circuit 9 is required to protect the internal circuit 3 from several KV to ten-pius KV of static electricity of either polarity that may be accidentally applied to the pad 10.

When positive static electricity applied to the pad 10 reaches the connection point between the anode of the diode 91 and the resistor 4, the diode 91 turns on in the forward direction to pass current to the first power supply terminal 11. The voltage at which the diode 91 begins to pass this current is called the threshold voltage. Since the positive voltage applied to the pad 10 is clamped at the forward threshold voltage of the diode 91, no voltage higher than this forward threshold voltage is applied to the internal circuit 3.

When negative static electricity applied to the pad 10 reaches the cathode of the diode 92 through the resistor 4, the diode 92 turns on in the forward direction to pass current to the pad 10 through the resistor 4. Since the negative voltage applied to the pad 10 is therefore clamped at the forward threshold voltage of the diode 92, no voltage of an absolute value higher than this forward threshold voltage is applied to the internal circuit 3.

Since the resistor 4 is connected in series between the pad 10 and the internal circuit 3, it also serves to smooth sharply rising noise components produced by static electricity.

The shrinking dimensions of MISFETs in recent years has led to increasingly thin MISFET gate insulating films. Since a thinner MISFET gate insulating film exhibits lower breakdown strength, the importance of the protection circuit is greater than in the past.

The protection capability of the conventional protection circuit using two diodes as described in the foregoing is dependent on the area of the PN junctions of the diodes. In the semiconductor device shown in FIG. 24, for instance, the protection of the internal circuit 3 by the protection circuit 9 can be enhanced in terms of the breakdown strength of the MTSFETs 1 and 2 constituting the internal circuit 3 by increasing the area of the PN junctions of the diodes 91, 92 constituting the protection circuit 9.

This is because increasing the area of the PN junctions of the diodes 91, 92 enables the diodes 91, 92 to pass a greater amount of current per unit time and reduces the current passage per unit area of the PN junctions constituting the diodes 91, 92. As a result, the protection capability of the protection circuit increases.

Decreasing the amount of current passed per unit area of the PN junctions of the diodes 91, 92 also suppresses generation of heat by the current passing through the PN junctions. Since this prevents thermal breakdown of the diodes 91, 92, it prevents breakdown of the protection circuit 9 itself.

However, an attempt to secure these advantages by increasing the area of the PN junctions of the diodes 91, 92 leads to a major problem, namely, that it increases the area of the semiconductor device accounted for by the protection circuit 9.

In order to protect the internal circuit 3 by clamping high voltages applied to the pad 10 owing to static electricity, the protection circuit 9 of FIG. 24 requires a separate clamping element for voltage of each of the positive and negative polarities generated by static electricity and thus requires the two diodes 91, 92.

An attempt to improve the protection capability of the protection circuit by increasing the area of the PN junctions of the diodes serving as the clamping devices therefore greatly increases the area occupied by the protection circuit. Moreover, additional space is taken up by the power lines of opposite polarity required for enabling the two diodes to pass surge currents produced when high voltages occur.

This reduces the amount of space available in the vicinity of the pad 10 for provision of circuitry other than the protection circuit 9 and, in turn, increases the area of the semiconductor device as a whole. Since this way of increasing protection capability therefore runs counter to the desire to reduce semiconductor device area and lower cost, it is best avoided.

On the other hand, an attempt to prevent increase in the overall area of the semiconductor device by reducing the layout area of the protection circuit 9 thwarts securement of adequate area for the PN junctions of the diodes 91, 92 constituting the protection circuit 9 and therefore degrades the protection of the internal circuit 3 from static electricity applied to the pad 10. Since it also reduces the width of the power lines of the protection circuit 9 and thus lowers the current capacity thereof, it also increases the risk of the protection circuit 9 itself breaking down.

This has led to the use of the protection circuit 91 shown in FIG. 25, which is configured using the diode 91 as the only clamping element. When a high negative voltage is applied to the pad 10, the voltage is clamped at the breakdown voltage of the diode 91.

Since this configuration requires only a single clamping element and a power line of only one polarity for each pad, it enables the area of the PN junction of the diode serving as the clamping element to be increased and the durability of the power line to be enhanced by increasing its width.

However, in the case of the protection circuit 91, the clamp voltage at the time of application of positive voltage to the pad 10 is equal to the forward threshold voltage of the diode 91, but the clamp voltage at the time of application of negative voltage to the Dad 10 is equal to the breakdown voltage of the diode 91 (about 50 V) and is therefore fairly large. Another disadvantage of this arrangement is that the diode degenerates with repeated breakdown.

In view of the foregoing problems of the prior art, an object of this invention is to provide a protection circuit for a semiconductor device which by use of a single clamping element per pad and without employing breakdown enables reliable protection of an internal circuit when a high electrostatic voltage of either positive or negative polarity is applied to the pad of the semiconductor device, which does not constrain the area available in the semiconductor device for provision of a circuit other than the protection circuit, and which eliminates the risk of breakdown of the protection circuit itself.

SUMMARY OF THE INVENTION

For achieving this object, this invention provides a protection circuit for a semiconductor device comprising at least one clamping circuit portion provided between at least one pad and at least one internal circuit of a semiconductor device and at least one gate circuit portion connected to the clamping circuit portion. The clamping circuit portion includes a MIS field effect transistor (MISFET) and the gate circuit portion has a gate circuit resistor and a capacitor.

The source and bulk terminal of the MISFET of the clamping circuit portion are connected to the pad and the internal circuit. The drain of the MISFET is connected to a first power supply terminal and the gate thereof is connected to one terminal of the gate circuit resistor and one terminal of the capacitor of the gate circuit portion. The other terminal of the gate circuit resistor is connected to a second power supply terminal and the other terminal of the capacitor is connected to the first power supply terminal.

When a positive surge voltage is applied to the pad, this semiconductor device protection circuit passes current from one terminal of the MISFET to the semiconductor substrate and passes current to the first power supply terminal through the bulk terminal and the drain of the MISFET. As a result, the positive surge voltage is clamped by the forward threshold voltage of the PN junction. When a negative surge voltage is applied to the pad, the MISFET turns on owing to the difference in potential between the source of the MISFET, which is at the potential of the electrostatic negative surge voltage, and the gate of the MISFET connected to the second power supply terminal through the gate circuit resistor.

As a result, current is passed from the first power supply terminal to the pad through the drain and source of the MISFET. The negative surge voltage is therefore clamped at the potential difference between the source and drain of the MISFET in its ON state.

When the semiconductor device has multiple pads and multiple internal circuits which send/receive electrical signals to/from the pads, a clamping circuit portion can be provided between each pad and the associated internal circuit, and the gates of the MISFETs of the clamping circuit portions can be connected to one terminal of the gate circuit resistor and one terminal of the capacitor of a single gate circuit portion.

The protection capability of the clamping circuit portion can be enhanced by providing a first resistor between the pad and the source and bulk terminals of the MISFET and a second resistor between the source and bulk terminals and the internal circuit.

A latch-up prevention effect can be obtained by constituting at least the first resistor as a thin film resistor.

If a high-voltage MISFET is used as the MISFET of the clamping circuit portion, the gate circuit portion can be omitted and the gate of the high-voltage MISFET be directly connected to the second power supply terminal.

The above and other objects, features and advantages of the invention will be apparent from the following detailed description which is to be read in conjunction with the accompanying drawings.

BRIEF DESCRIPTION OF THE DRAWINGS

FIG. 14 is a sectional view similar to FIG. 13 showing a third example of the high-voltage MISFET 5' in FIG. 9.

DETAILED DESCRIPTION OF THE PREFERRED EMBODIMENTS

Embodiments of the semiconductor device protection circuit according to the invention will now be explained with reference to the drawings.

First Embodiment: FIGS. 1–5

Figure 1:
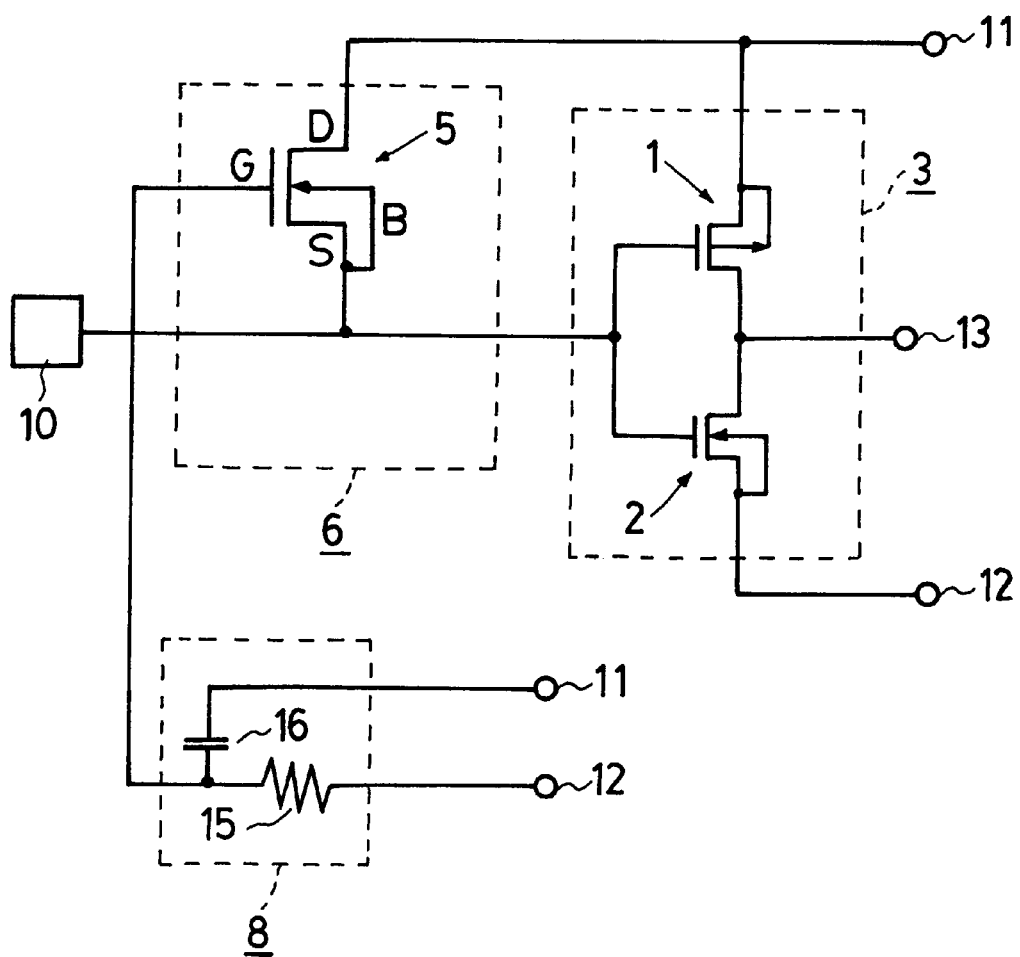
FIG. 1 is a circuit diagram showing a protection circuit for a semiconductor device which is first embodiment of the invention and an internal circuit protected thereby.

FIG. 1 is a circuit diagram showing a protection circuit for a semiconductor device which is first embodiment of the invention and an internal circuit protected thereby. Portions similar to those in the prior art example of FIG. 24 explained earlier are assigned the same reference numerals as those in FIG. 24.

The protection circuit of FIG. 1 comprises a clamping circuit portion 6 provided between a pad 10 and an internal circuit 3 of a semiconductor device and a gate circuit portion 8 connected to the clamping circuit portion 6.

The pad 10 serves as a terminal through which electrical signals are exchanged between the internal circuit 3 of the semiconductor device and an external circuit or the like. It is formed of the same material, e.g., aluminum, as that of the metal wiring used in the semiconductor device.

The clamping circuit portion 6 comprises an N-channel metal-insulator-semiconductor field effect transistor (MISFET) 5. The gate circuit portion 8 connected to the clamping circuit portion 6 comprises a gate circuit resistor 15 and a capacitor 16.

In the protection circuit shown in FIG. 1, the source S and the bulk terminal B of the MISFET 5 of the clamping circuit portion 6 are connected to a common connection terminal which is connected to the pad 10, the gate of a P-channel MISFET 1 constituting one member of the internal circuit 3 and the gate of an N-channel MISFET 2 constituting another member thereof. The drain D of the MISFET 5 is connected to a first power supply terminal 11 and the gate G thereof is connected to one terminal of the gate circuit resistor 15 constituting one member of the gate circuit portion 8 and one terminal of a capacitor 16 constituting another member thereof. The other terminal of the gate circuit resistor 15 is connected to a second power supply terminal 12 and the other terminal of the capacitor 16 is connected to the first power supply terminal 11.

The first power supply terminal 11 is supplied with a base voltage (VDD) and the second power supply terminal 12 is supplied with a negative supply voltage (VSS).

Figure 2:
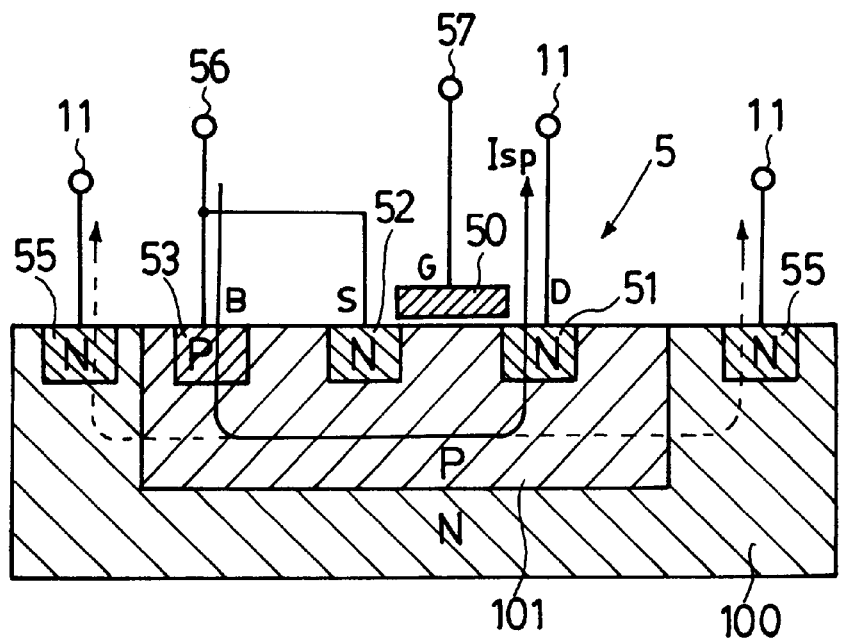
FIGS. 2 and 3 are sectional views schematically illustrating the clamping circuit portion 6 shown in FIG. 1.
Figure 3:
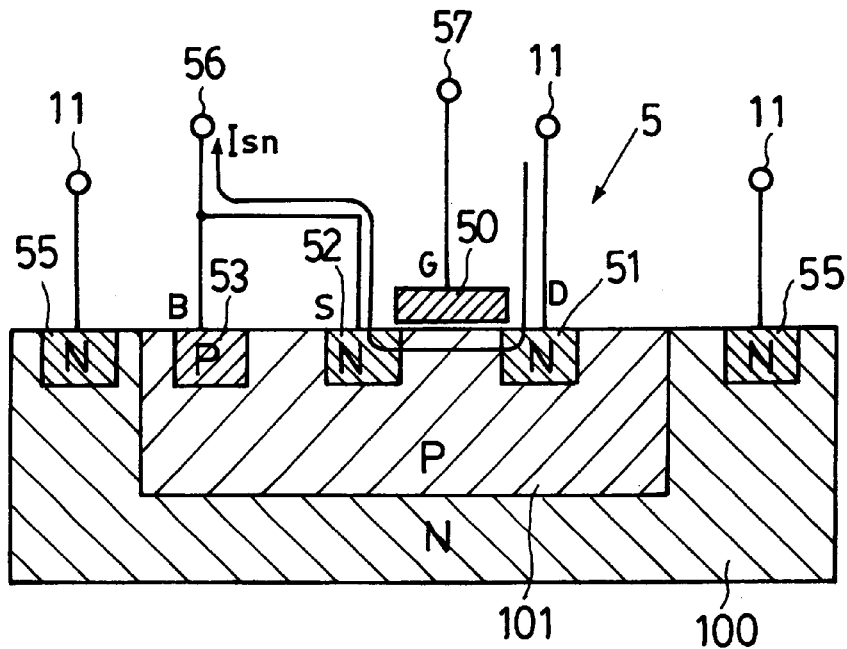

FIGS. 2 and 3 are sectional views schematically illustrating the clamping circuit portion 6 shown in FIG. 1. FIG. 2 is for explaining the operation when a positive surge voltage is clamped and FIG. 3 is for explaining the operation when a negative is clamped.

The source, gate, drain and bulk terminals of the N-channel MISFET 5 shown in FIGS. 1–3 are respectively designated by symbols S, G, D and B. These terminals are constituent members of the MISFET and their symbols are the initial letters of their names.

The clamping circuit portion 6 shown in FIGS. 2 and 3 has an N-type semiconductor substrate 100 and a P-type well 101 forming a region within the N-type semiconductor substrate 100 of a different conductivity type impurity from the N-type semiconductor substrate 100. The N-channel MISFET 5 is configured in the P-type well 101.

Specifically, the P-type well 101 is provided therein with a P-type diffused layer 53 forming the bulk terminal B of the MISFET 5, an N-type diffused layer 52 doped with impurity of the same conductivity type as the N-type semiconductor substrate 100 and forming the source S, an N-type diffused layer 51 spaced apart from the N-type diffused layer 52 and forming the drain D. A gate electrode 50 (the gate G) is formed above and between the diffused layer 52 and the diffused layer 51.

The gate electrode 50 (gate G) of the N-channel MISFET 5 is constituted of polycrystalline silicon.

An N-type diffused layer 55 is formed around the P-type well 101 of the N-type semiconductor substrate 100. The N-type diffused layer 55 is connected to the first power supply terminal 11. The N-type diffused layer 51 constituting the drain D of the MISFET 5 is also connected to the first power supply terminal 11.

The P-type diffused layer 53 constituting the bulk terminal B of the MISFET 5 and the N-type diffused layer 52 constituting the source S are connected to the pad shown in FIG. 1 through a common connection terminal 56.

The gate electrode 50 (gate G) is connected to the gate circuit portion 8 shown in FIG. 1 through a gate connection terminal 57 and through the gate circuit resistor 15 of the gate circuit portion 8 to the second power supply terminal.

Figure 4:
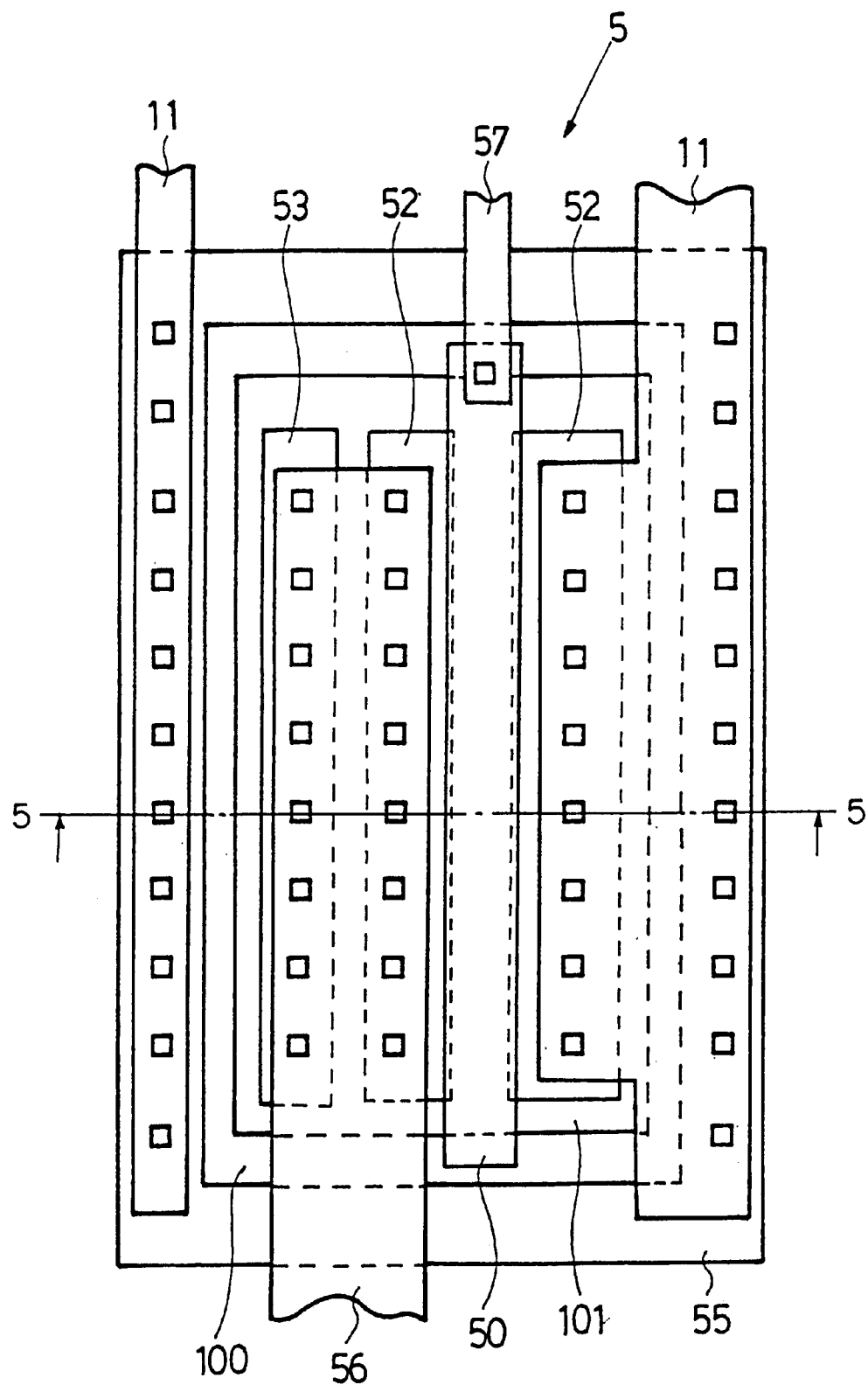
FIG. 4 is a plan view schematically illustrating the same clamping circuit portion 6.

FIG. 4 is a plan view schematically illustrating the same clamping circuit portion 6 of FIG. 1. Each of the numerous small blank squares in FIG. 4 represents a contact hole for connecting an underlying diffusion layer or electrode and an overlying terminal (wire).

Figure 5:
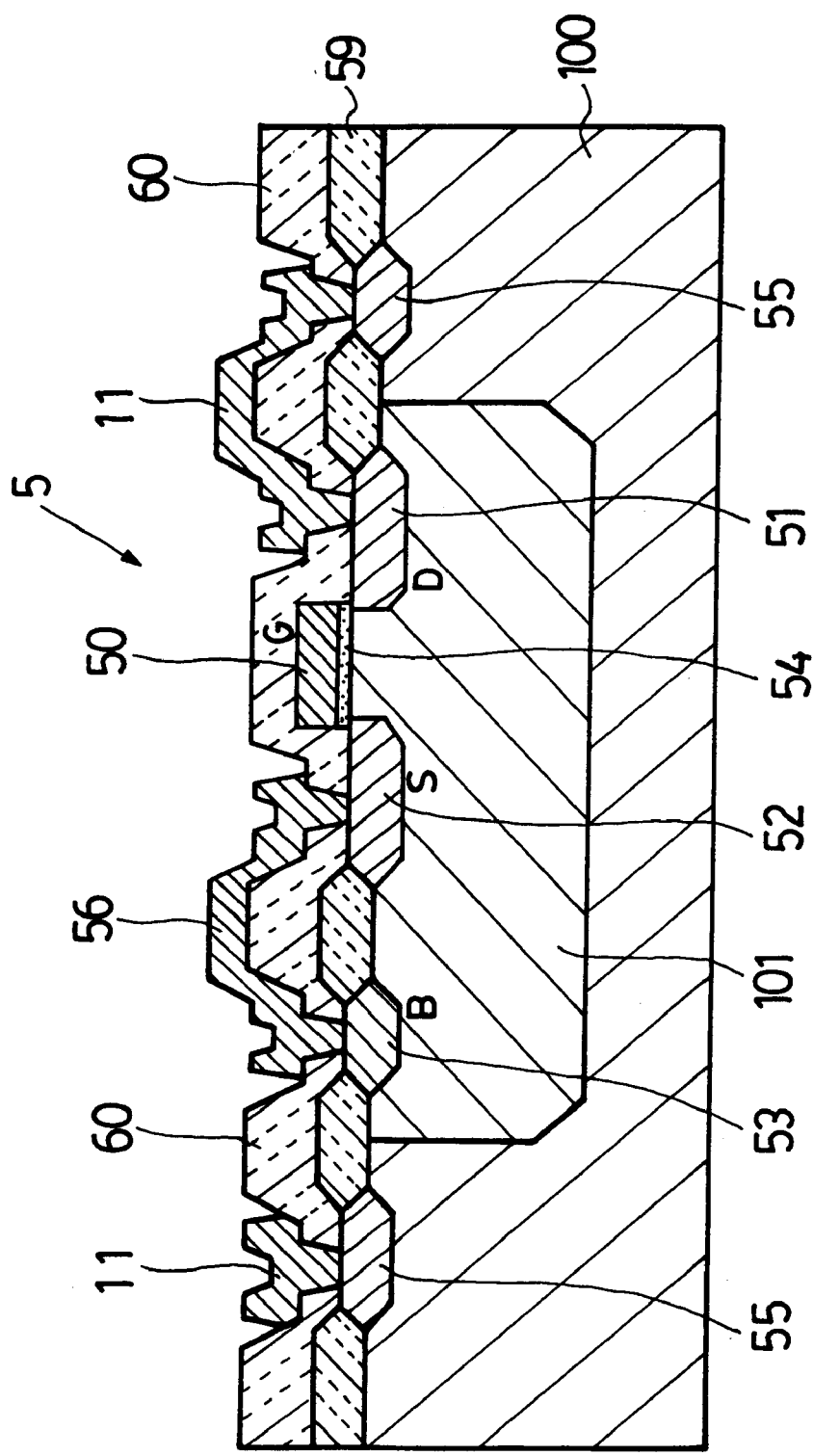
FIG. 5 is an enlarged sectional view taken along line A—A in FIG. 4, substantially showing the actual configuration.

FIG. 5 is an enlarged sectional view taken along line 5—5 in FIG. 4, substantially showing the actual configuration. In FIG. 5, reference numeral 59 designates a field oxide film formed on the N-type semiconductor substrate 100 and the P-type well 101 for insulating the diffused layers 51, 52, 53 and 55 from each other. Reference numeral 60 designates an insulating layer for insulating the first power supply terminal 11, the connection terminal 56 and the gate electrode 50 from each other. Reference numeral 54 designates a gate insulating layer formed between the gate electrode 50 and the upper surface of the well 101.

The operation of this semiconductor device protection circuit will now be explained mainly with reference to FIGS. 1–3. The voltage clamping characteristic of the clamping circuit portion 6 of the protection circuit will be explained first.

When positive static electricity is applied to the pad 10 shown in FIG. 1, the resulting positive surge voltage advances from the pad 10 to the connection terminal 56 (FIG. 2) between the source S and the bulk terminal B of the N-channel MISFET 5 of the clamping circuit portion 6.

Since the P-type diffused layer 53 forming the bulk terminal B of the N-channel MISFET 5 shown in FIG. 2 and the P-type well 101 thereof are of the same conductivity type, the potential of the P-type well 101 instantaneously becomes the same as that of the P-type diffused layer 53. The P-type well 101 and the N-type diffused layer 51 forming the drain D of the N-channel MISFET 5 form a PN junction.

Upon reaching the source S and the bulk terminal B of the N-channel MISFET 5, the positive surge voltage produces an electric field that biases the PN junction formed by the P-type well 101 and the N-type diffused layer 51 in the forward direction.

As explained earlier, the threshold voltage of the PN junction is the voltage at which PN junction begins to pass current. The voltage at which current begins to flow when a forward-direction field is applied to a PN junction is called the forward threshold voltage. It is well known that the threshold voltage of a PN junction is determined by the impurity concentrations of the P-type semiconductor and the N-type semiconductor and that the threshold voltage decreases with increasing impurity concentration.

Since the impurity concentration of the P-type diffused layer 53 constituting the bulk terminal B of the N-channel MISFET 5 and that of the N-type diffused layer 51 constituting the drain D thereof are ordinarily higher than that of the P-type well 101, the threshold voltages of the PN junctions formed therebetween are low.

As the positive electrostatic voltage applied to the pad 10 is much higher than the forward threshold voltage of the PN junction formed between the P-type well 101 and the N-type diffused layer 51, the PN junction turns on in the forward direction. Therefore, as indicated by the solid-line arrow in FIG. 2, positive surge current $I_{sp}$ flows to the first power supply terminal 11 for supplying the base voltage.

A PN junction with a somewhat higher threshold voltage is formed between the P-type well 101 and the N-type semiconductor substrate 100. Since this also turns on in the forward direction, some amount of current flows to the first power supply terminal 11 through the PN junction surface and the N-type diffused layer 55, as indicated by the broken-line arrows in FIG. 2.

As a result, the positive surge voltage applied to the pad 10 is clamped at the low threshold voltage of these PN junctions to prevent application of any higher voltage to the internal circuit 3 shown in FIG. 1.

The operation when a negative static electricity is applied to the pad 10 shown in FIG. 1 will now be explained with reference to FIG. 3. The negative surge voltage produced by the negative static electricity advances from the pad 10 shown in FIG. 1 to the source S and the bulk terminal B of the N-channel MISFET 5 of the clamping circuit portion 6.

As in the case of positive surge voltage produced by positive static electricity, the potential of the P-type well 101 instantaneously becomes the same as that of the P-type diffused layer 53.

Since the N-type diffused layer 51 constituting the drain D of the N-channel MISFET 5 is connected to the first power supply terminal 11 for supplying the base voltage, a reverse-direction field is applied to the PN junction constituted by the P-type well 101 and the N-type diffused layer 51.

The voltage at which current begins to flow when a reverse-direction field is applied to a PN junction is called the reverse threshold voltage or, more generally, the breakdown voltage. The phenomenon of current flowing through a PN junction under application of a reverse field is called breakdown. While the breakdown voltage of a PN junction is determined by the impurity concentrations of the P-type semiconductor and the N-type semiconductor, it is generally made to be a voltage that is much higher than the voltage at which the MISFET turns on, so as not to interfere with the normal operation of the MISFET.

The PN junction constituted by the P-type well 101 and the N-type diffused layer 51 constituting the drain D of the MISFET 5 is, as mentioned above, applied with a reverse-direction field.

The gate G of the MISFET 5 is applied with the negative supply voltage of the second power supply terminal 12 through the gate circuit resistor 15 of the gate circuit portion 8. Since the negative surge voltage applied to the source S and the bulk terminal B is a much larger negative voltage than this negative supply voltage applied to the gate G, the N-channel MISFET 5 is immediately turned on by this potential difference.

Therefore, before the PN junction constituted by the P-type well 101 and the N-type diffused layer 51 constituting the drain D begins to pass current owing to breakdown, the N-type diffused layer 52 constituting the source S of the N-channel MISFET 5 and the N-type diffused layer 51 constituting the drain D thereof conduct. As indicated by the arrow in FIG. 3, therefore, negative surge current $I_{sn}$ flows from the first power supply terminal 11 connected to the diffused layer 51 for supplying the base voltage, through the diffused layer 52 and the connection terminal 56, to the pad 10.

When the N-channel MISFET 5 turns on, the potential difference arising between the source S and the drain D is small because of the small resistance to conduction between the source S and the drain D. Therefore, since the surge voltage is clamped at this small potential difference, no potential difference larger than this is applied to the internal circuit 3 shown in FIG. 1.

The characteristic of the protection that the gate circuit portion 8 of the protection circuit provides for the clamping circuit portion 6 will now be explained. The gate circuit resistor 15 and capacitor 16 of the gate circuit portion 8 shown in FIG. 1 serve to protect the gate G of the N-channel MISFET 5 of the clamping circuit portion 6 from noise-related voltage fluctuations superimposed on the second power supply terminal 12 for supplying the negative supply voltage owing to static electricity or the like.

The gate circuit portion 8 connects the gate G of the N-channel MISFET 5 of the clamping circuit portion 6 through the gate circuit resistor 15 to the second power supply terminal 12 for supplying the negative power supply voltage.

Noise-related voltage fluctuations caused by static electricity or the like may be superimposed on the negative supply voltage supplied to the second power supply terminal 12. Voltages produced by positive or negative static electricity or the like may be applied to the second power supply terminal 12 either directly or indirectly through circuitry and the like constituting the semiconductor device. These voltages are superimposed on the negative supply voltage as noise-related voltage fluctuations.

Irrespective of the voltage polarity, if the gate G of the N-channel MISFET 5 of the clamping circuit portion 6 is directly connected to the second power supply terminal 12, the noise-related noise fluctuation is applied to the gate G, causing the N-channel MISFET 5 to malfunction.

Specifically, turn-on of the N-channel MISFET 5 may cause a normal electrical signal sent/received by the internal circuit 3 via the pad 10 to be clamped at the base voltage supplied by the first power supply terminal 11.

This produces a malfunction because the internal circuit 3 is no longer able to effect normal exchange of signals. Moreover, depending on the strength of the noise-related noise fluctuation superimposed on the second power supply terminal 12 for supplying the negative supply voltage, the gate G of the N-channel MISFET 5 may be destroyed.

Therefore, the gate circuit resistor 15 of the gate circuit portion 8 is connected between the second power supply terminal 12 for supplying the negative supply voltage and the gate G of the N-channel MISFET 5 of the clamping circuit portion 6, and the capacitor 16 of the gate circuit portion 8 is connected between the first power supply terminal 11 for supplying the base voltage and the gate G.

The CR time constant defined by the capacitance component of the capacitor 16 and the resistance component of the gate circuit resistor 15 attenuates the noise-related noise fluctuation superimposed on the second power supply terminal 12 for supplying negative power supply voltage. As a result, the gate G of the N-channel MISFET 5 of the clamping circuit portion 6 is protected from malfunction or destruction.

The capacitance component of the capacitor 16 of the gate circuit portion 8 need only be several times the stray capacitance parasitically resident in the gates of the P-channel MISFET 1 and N-channel MISFET 2 of the internal circuit 3. For example, one five times the stray capacitance is adequate, but the larger the capacitance of the capacitor 16 the better.

The characteristic operations of the semiconductor device protection circuit according to the first embodiment of the invention explained in the foregoing are summarized in the following.

When a surge voltage produced by positive static electricity is applied to the pad 10, the PN junctions that the P-type well 101 of the N-channel MISFET 5 of the clamping circuit portion 6 forms with the N-type drain D and the N-type semiconductor substrate 100 are biased in the forward direction, whereby they turn on in the forward direction to pass positive surge current to the first power supply terminal 11 for supplying base voltage. As a result, the positive surge voltage is clamped at the low threshold voltage of these PN junctions.

When a surge voltage produced by negative static electricity is applied to the pad 10, the bulk terminal B and the source S of the N-channel MISFET 5 of the clamping circuit portion 6 are applied between themselves and the negative supply voltage applied from the gate circuit portion 8 connected with the gate G with a field that turns the N-channel MISFET 5 on, whereby conductivity is established between the source S and the drain D to pass surge current from the first power supply terminal 11 for supplying base voltage to the pad 10. As a result, the negative surge voltage is clamped at the small potential difference produced between the source S and the drain D of the MISFET 5.

The semiconductor device protection circuit of this first embodiment has features which markedly distinguish it from the prior-art protection circuit. Specifically, the prior-art protection circuit shown in FIG. 24 requires two diodes as clamping elements in order to clamp positive and negative surge voltages applied to the pad 10.

On the other hand, in the semiconductor device protection circuit shown in FIG. 1, the clamping circuit portion 6 for clamping positive and negative surge voltages applied to the pad 10 is provided with only a single N-channel MISFET 5 as a clamping element.

Figure 24:
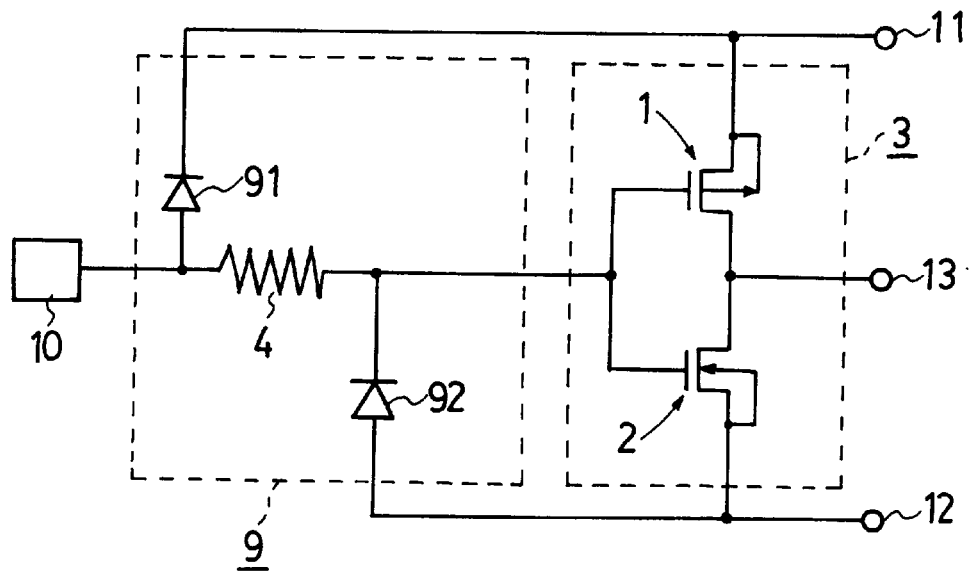
FIG. 24 is a circuit diagram showing an example of a prior-art protection circuit for a semiconductor device and an internal circuit protected thereby.

Moreover, to improve the protection capability of the prior-art protection circuit shown in FIG. 24 it is necessary to enlarge the PN junction between the two diodes 91, 92. As pointed out earlier, however, this increases the area occupied by the protection circuit within the semiconductor device and reduces the area available for provision of other circuitry.

In contrast, to improve the protection capability of the semiconductor device protection circuit shown in FIG. 1 it suffices to enlarge the N-channel MISFET 5. Specifically, it suffices to enlarge the areas of the P-type diffused layer 53, N-type diffused layer 52 and N-type diffused layer 51, respectively corresponding to the bulk terminal B, source S and drain D of the N-channel MISFET 5 shown in FIGS. 2–5, and the area of the N-type semiconductor substrate 100 thereof.

The effect of this is the same as that of increasing the areas of the PN junctions of the diodes 91, 92 of the prior-art protection circuit shown in FIG. 24.

Since the semiconductor device protection circuit according to this invention shown in FIG. 1–5 needs only one MISFET as a clamping element per pad, the layout area of the clamping element within the semiconductor device is much smaller than in the case of the prior-art protection circuit shown in FIG. 24. Therefore, even if the MISFET 5 is provided to have sufficient protection capability, no problem of reducing the area available for other circuitry arises.

This configuration of the protection circuit with a single clamping element provides another advantage. Specifically, in the prior-art protection circuit shown in FIG. 24, the power supply wiring must include a wire for supplying the base voltage and a wire for supplying the negative supply voltage.

The power supply wiring of the semiconductor device protection circuit according to this invention shown in FIG. 1 similarly has to include the first power supply terminal 11 for supplying the base voltage and the second power supply terminal 12 for supplying the negative supply voltage.

However, as explained earlier, the operation of the prior-art protection circuit is achieved by passing current through the diodes 91, 92 (the clamping elements) shown in FIG. 24. Since the diodes 91, 92 clamp high electrostatic voltages and the like applied to the pad 10, the currents passing therethrough are very large.

A semiconductor device generally uses aluminum or other metal wiring. When a metal wire is required to carry a large current, breakage by fusion owing to stress produced by current-induced heat generation is countered by such wiring techniques as increasing the metal wire width.

For reasons such as this, realization of the prior-art protection circuit shown in FIG. 24 has required use of extremely wide metal wires for connecting the diode 91 with the first power supply terminal 11 and the diode 92 with the second power supply terminal 12.

In contrast, the semiconductor device protection circuit according to the invention shown in FIG. 1 does not pass current to the second power supply terminal 12 for supplying negative supply voltage during its protection operation. Since the metal wire connecting the gate G of the MISFET 5 with the gate circuit resistor 15 of the gate circuit portion 8 and the second power supply terminal 12, i.e., the wire for connection with the second power supply terminal 12 for supplying the negative supply voltage, is therefore not required to resist heavy current flow, it can have a width similar to that of the ordinary metal wiring used in the internal circuit.

In the semiconductor device protection circuit according to the first embodiment of the invention, therefore, surge voltages of either positive or negative polarity applied to the semiconductor device can, by a single clamping element, be passed to the first power supply terminal 11 and absorbed through a single metal wire.

Figure 25:
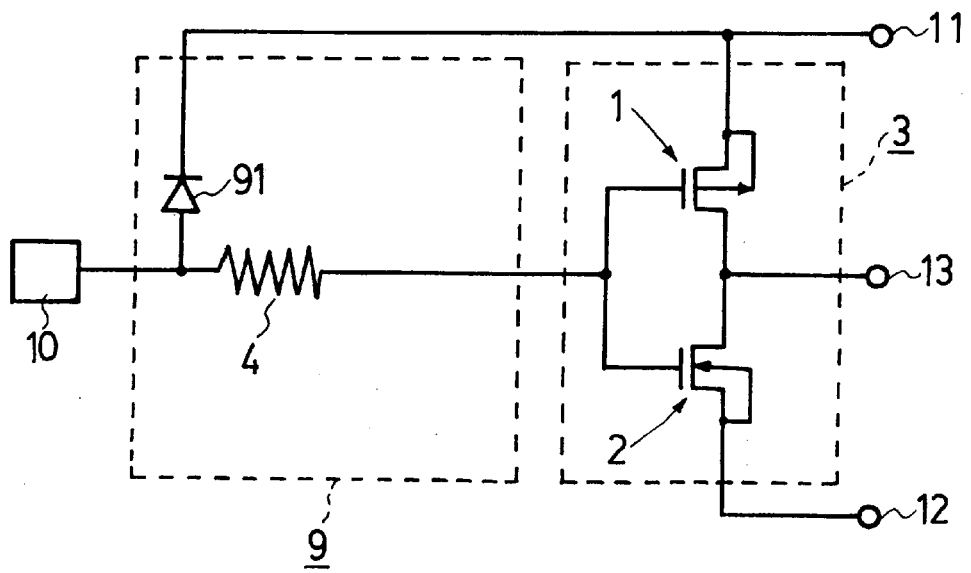
FIG. 25 is a circuit diagram showing another example of a prior-art protection circuit for a semiconductor device and an internal circuit protected thereby.

In other words, a very compact protection circuit can be configured since a single clamping element suffices for applied surge voltages of either polarity. In addition, since, unlike in the conventional configuration shown in FIG. 25, no use is made of breakdown operation for protection against surge voltages of one polarity, such problems as increase in the clamp voltage and early degradation of the clamping element do not arise.

Figure 6:
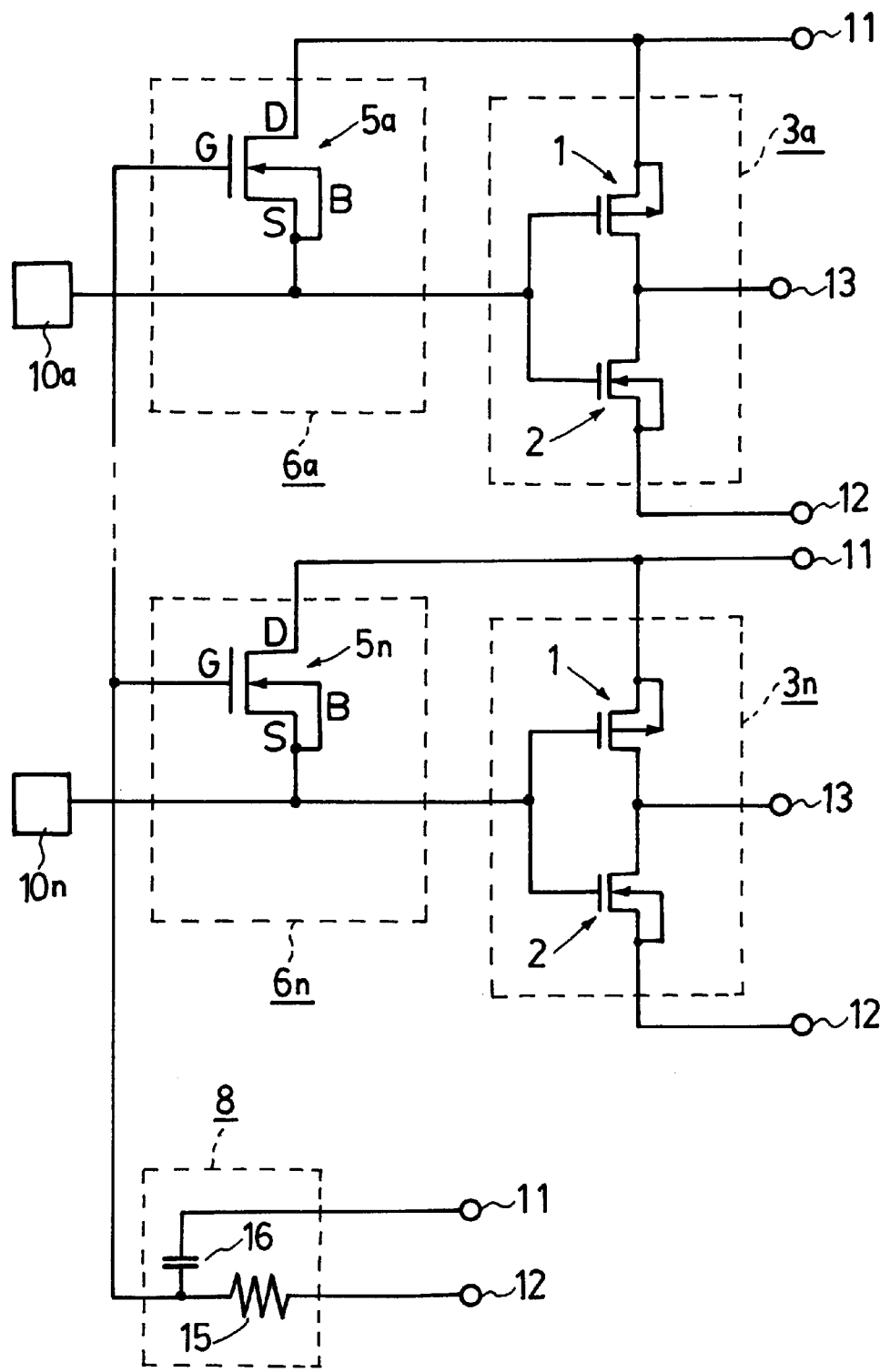
FIG. 6 is a circuit diagram showing a protection circuit for a semiconductor device which is a second embodiment of the invention and internal circuits protected thereby.

Second Embodiment: FIG. 6

A second embodiment of the protection circuit for a semiconductor device according to the invention will now be explained with reference to FIG. 6. Portions in FIG. 6 which are identical with those in FIG. 1 are assigned the same reference symbols as those in FIG. 1.

The semiconductor device shown in FIG. 6 has a plurality of pads 10a . . . 10n and a plurality of internal circuits 3a . . . 3n which send/receive signals via these pads.

The protection circuit is constituted of a plurality of clamp circuits 6a . . . 6n provided between the pads 10a . . . 10n and the associated internal circuits 3a . . . 3n, and a single gate circuit portion 8 connected to the clamping circuit portions 6a . . . 6n.

The plurality of clamping circuit portions 6a . . . 6n comprise N-channel MISFETs 5a . . . 5n, while the gate circuit portion 8 comprises a gate circuit resistor 15 and a capacitor 16. The gate circuit portion 8 is of the same configuration as the aforesaid first embodiment gate circuit portion 8 shown in FIG. 1.

The interconnection among the constituent elements of the semiconductor device protection circuit will now be explained.

As shown in FIG. 6, each pad 10a . . . 10n is connected to the common connection terminal of the source S and bulk terminal B of the associated N-channel MISFET 5a . . . 5n of the associated clamping circuit portion 6a . . . 6n and to the gates of the P-channel MISFET 1 and the N-channel MISFET 2 of the associated internal circuits 3a . . . 3n, while the drain D of each N-channel MISFET 5a . . . 5n is connected to the first power supply terminal 11.

The gate G of each N-channel MISFET 5a . . . 5n is connected to one terminal of the gate circuit resistor 15 constituting one member of the gate circuit portion 8 and one terminal of the capacitor 16 constituting another member thereof. The other terminal of the gate circuit resistor 15 is connected to the second power supply terminal 12 and the other terminal of the capacitor 16 is connected to the first power supply terminal 11.

This second embodiment of the semiconductor device protection circuit enables the area of the protection circuit to made even smaller than in the first embodiment shown in FIG. 1 while nevertheless maintaining the characteristic features of the first embodiment of the semiconductor device protection circuit.

This is because instead of providing a separate gate circuit portion 8 between each pad 10a . . . 10n and the associated internal circuit 3a . . . 3n of the isemiconductor device a single gate circuit portion 8 is connected to all of the clamping circuit portions 6a . . . 6n.

Since the gate circuit portion 8 is for supplying voltage to the gates G of the N-channel MISFETs 5a . . . 5n of the clamping circuit portions 6a . . . 6n, the provision of only a single gate circuit portion 8 at a certain portion of the semiconductor device creates no problem whatsoever.

Thus while providing the same effects as the first embodiment explained earlier, the second embodiment of the semiconductor device protection circuit is in addition highly effective for minimizing semiconductor device area since it further reduces the area occupied by the protection circuit in the vicinity of the pads without encroaching on the area to be occupied by circuitry, other than the protection circuit, to be provided in the vicinity of the pads.

Figure 7:
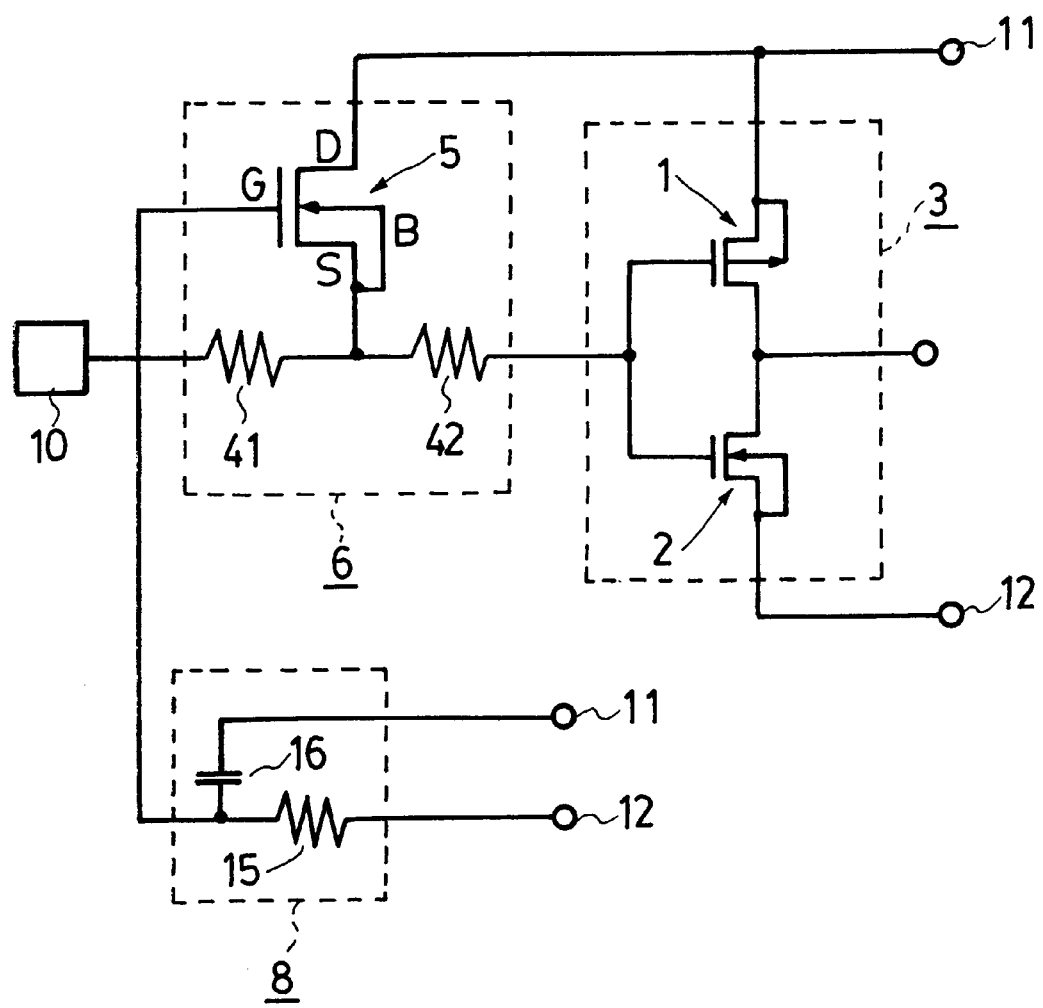
FIG. 7 is a circuit diagram showing a protection circuit for a semiconductor device which is third embodiment of the invention and an internal circuit protected thereby.

Third Embodiment: FIG. 7

A third embodiment of the protection circuit for a semiconductor device according to the invention will now be explained with reference to FIG. 7. Portions in FIG. 7 which are identical with those in FIG. 1 are assigned the same reference symbols as those in FIG. 1 and are not explained again here.

The semiconductor device protection circuit shown in FIG. 7 differs from the semiconductor device protection circuit shown in FIG. 1 only in the point that the clamping circuit portion 6 is constituted of the N-channel MISFET 5, a first resistor 41 and a second resistor 42.

The first resistor 41 is inserted between the pad 10 and the common connection terminal of the source S and bulk terminal B of the N-channel MISFET 5, and the second resistor 42 is inserted between the common connection terminal of the source S and bulk terminal B of the MISFET 5 and the gates of the P-channel MISFET 1 and the N-channel MISFET 2 of the internal circuit 3.

In other aspects the configuration is the same as that of the first embodiment of the invention semiconductor device protection circuit shown in FIG. 1.

In this third embodiment, the first resistor 41 and the second resistor 42 provided in the clamping circuit portion 6 function as current limiting elements and serve to protect the N-channel MISFET 5 and the internal circuit 3.

Irrespective of whether the polarity of static electricity applied to the pad 10 is positive or negative, current flows to the N-channel MISFET 5 of the clamping circuit portion 6. The first resistor 41 limits the current passing to the MISFET 5 to protect the MISFET 5 itself from destruction.

The second resistor 42 included in the clamping circuit portion 6 is provided between the N-channel MISFET 5 and the internal circuit 3. As a result, it limits current passing from the pad 10, through the clamping circuit portion 6 to the internal circuit 3, thereby protecting the internal circuit 3 from destruction.

The third embodiment of the semiconductor device protection circuit shown in FIG. 7 thus achieves a further improvement of the protection capability beyond that of the first embodiment of the semiconductor device protection circuit shown in FIG. 1.

Moreover, since the first resistor 41 protects the clamping circuit portion 6 and the second resistor 42 protects the internal circuit 3, the load on the clamping circuit portion 6 is smaller than that in the first embodiment, enabling a reduction in the overall size of the clamping circuit.

Since the first resistor 41 and the second D resistor 42 of the clamping circuit portion 6 are connected in series between the pad 10 and the internal circuit 3, however, they become a hindrance if the internal circuit 3 operates at high speed. In consideration of the high-speed exchange of signals between the internal circuit 3 and external circuits via the pad 10, it is necessary at the time of designing the semiconductor device to select the resistance values of the first resistor 41 and the second resistor 42 from within the range of resistance values that do not interfere with signal transmission.

Figure 8:
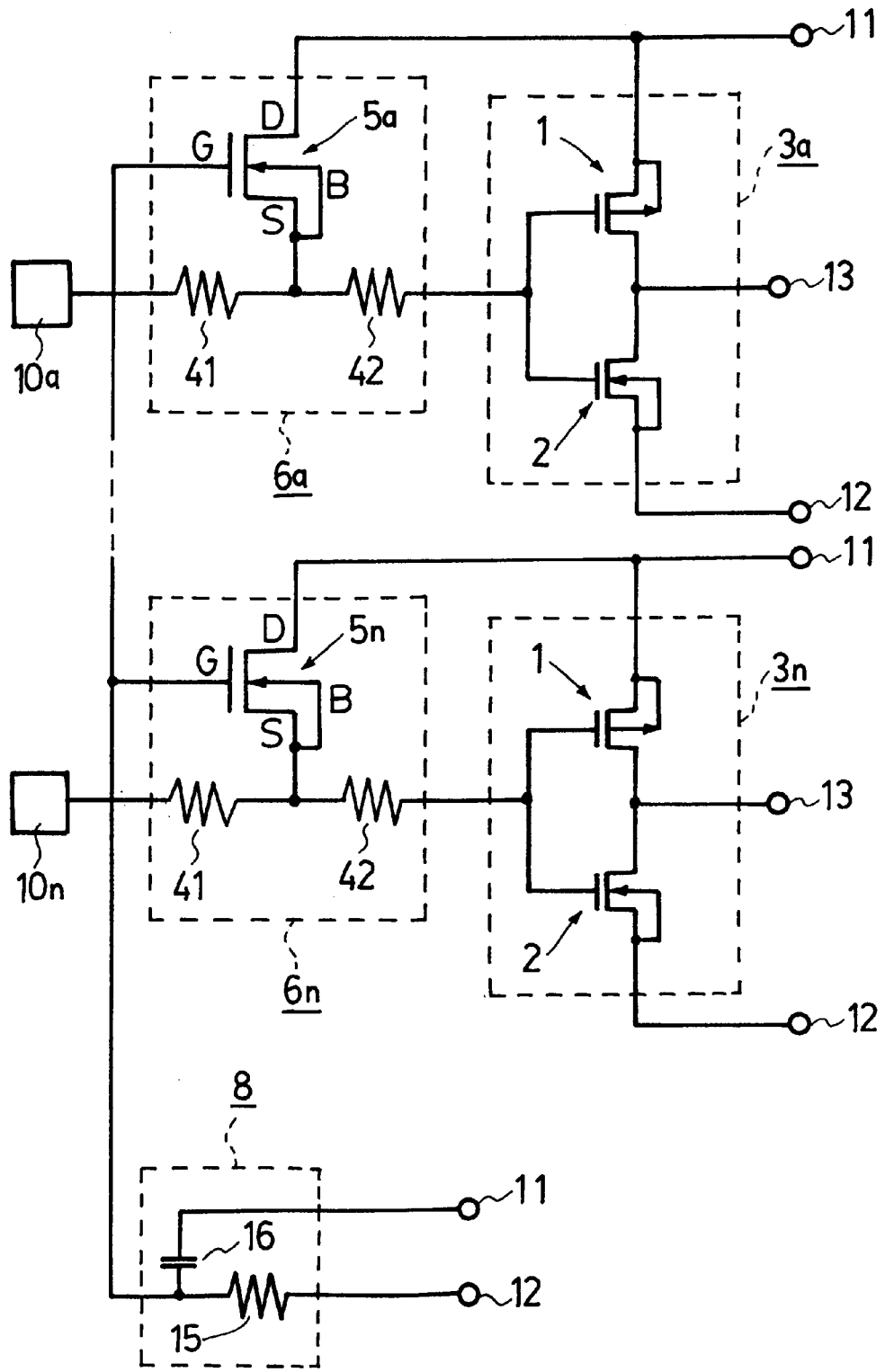
FIG. 8 is a circuit diagram showing a protection circuit for a semiconductor device which is a fourth embodiment of the invention and internal circuits protected thereby.

Fourth Embodiment: FIG. 8

A fourth embodiment of the protection circuit for a semiconductor device according to the invention will now be explained with reference to FIG. 8. Portions in FIG. 8 which are identical with those in FIGS. 6 and 7 are assigned the same reference symbols as those in FIGS. 6 and 7 and are not explained again here.

The fourth embodiment of the invention semiconductor device protection circuit shown in FIG. 8 is constituted of clamp circuit portions 6a ... 6n provided between a plurality of pads 10a ... 10n and a plurality of associated internal circuits 3a ... 3n, and a single gate circuit portion 8 connected to the clamping circuit portions 6a ... 6n. In this respect, the configuration is the same as that of the second embodiment shown in FIG. 6.

However, each of the clamping circuit portions 6a ... 6n is constituted of an N-channel MISFET 5a ... 5n, a first resistor 41 and a second resistor 42. In this point the configuration is the same as that of the third embodiment shown in FIG. 7.

Therefore, like the second embodiment of the semiconductor device protection circuit shown in FIG. 6, this fourth embodiment of the semiconductor device protection circuit is also highly effective for minimizing semiconductor device area since it reduces the area occupied by the protection circuit in the vicinity of the pads, while, like the third embodiment of the semiconductor device protection circuit shown in FIG. 7, it achieves enhanced protection capability.
Fifth Embodiment: FIGS. 9–18

A fifth embodiment of the protection circuit for a semiconductor device according to the invention will now be explained with reference to FIGS. 9–18.

Figure 9:
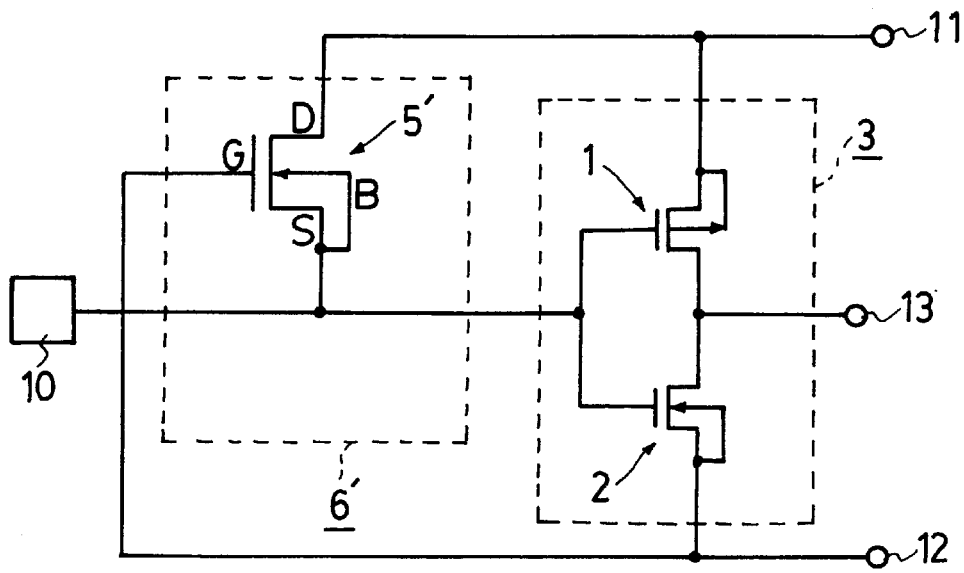
FIG. 9 is a circuit diagram showing a protection circuit for a semiconductor device which is a fifth embodiment of the invention and an internal circuit protected thereby.

FIG. 9 is a circuit diagram showing the fifth embodiment of the semiconductor device protection circuit of the invention and an internal circuit protected thereby. Portions which are identical with those in FIG. 1 are assigned the same reference symbols as those in FIG. 1.

In the semiconductor device protection circuit shown in FIG. 9, a clamping circuit portion 6' provided between a pad 10 and an internal circuit 3 is constituted of N-channel high-voltage MISFET 5'.

The gate circuit portion 8 of the semiconductor device protection circuit shown in FIG. 1 is omitted and the gate G of the N-channel high-voltage MISFET 5' of the clamping circuit portion 6' is directly connected to the second power supply terminal 12. In other aspects the circuit configuration is the same as that of the first embodiment shown in FIG. 1.

The fifth embodiment of the semiconductor device protection circuit therefore provides the same functions as the first embodiment of the semiconductor device protection circuit shown in FIG. 1, while enabling a further reduction in the layout area of the protection circuit owing to the omission of the gate circuit portion.

For this, the fifth embodiment of the semiconductor device protection circuit employs the high-voltage MISFET 5' as the clamping element of the clamping circuit portion 6'. The gate G of the high-voltage MISFET 5' tis configured somewhat differently from that of the MISFET 5 used in the first to fourth embodiments.

Examples of the configuration of the N-channel high-voltage MISFET 51 are explained in the following.

FIRST EXAMPLE

Figure 10:
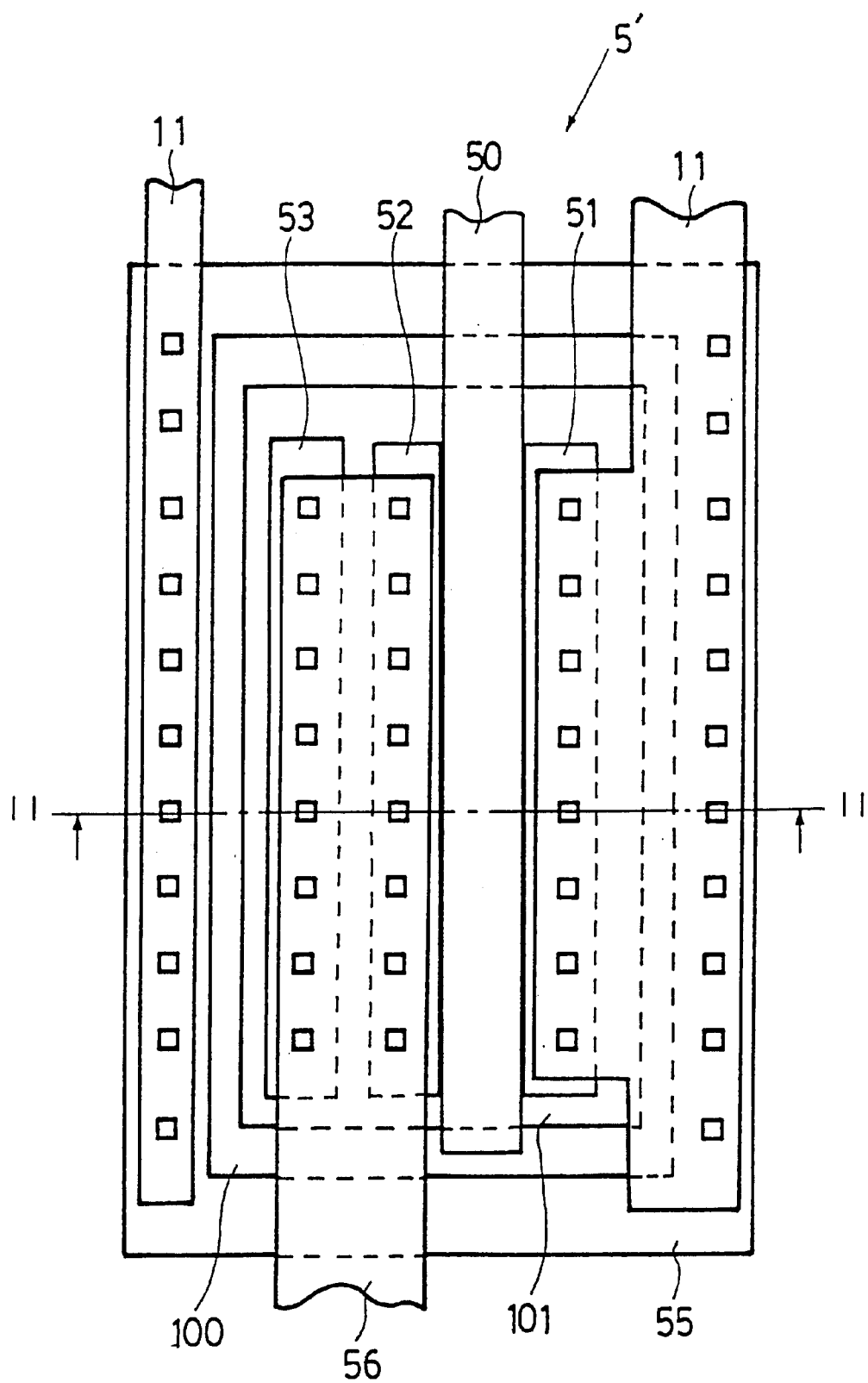
FIG. 10 is a plan view.
Figure 11:
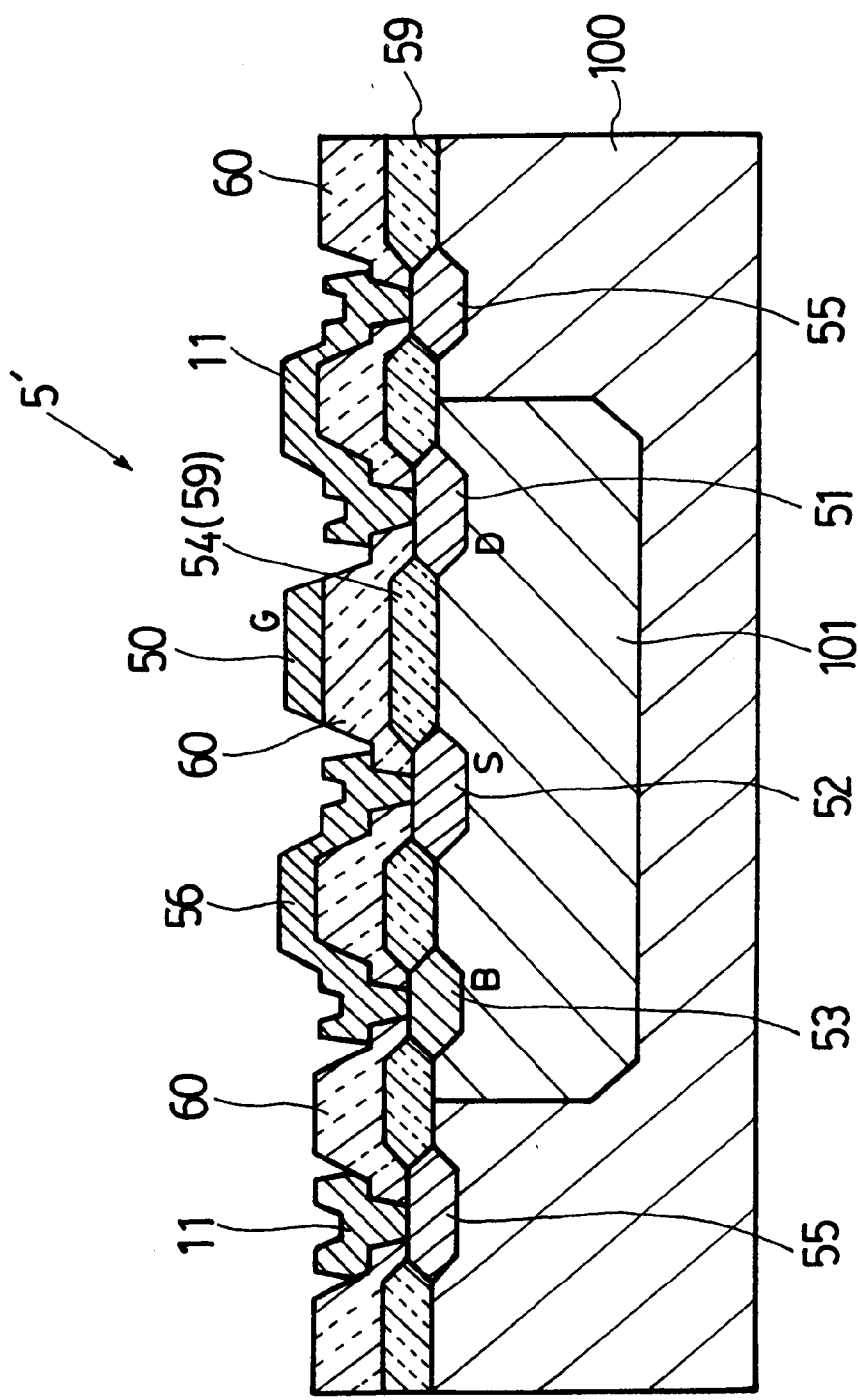
FIG. 11 is a sectional view taken along line 11—11 of the plan view showing a first example of the high-voltage MISFET 5' in FIG. 9.

FIG. 10 is a plan view and FIG. 11 is a sectional view similar to those of FIGS. 4 and 5 showing a first example of the N-channel high-voltage MISFET 5'. Portions that correspond to, but are not necessarily identical with, those of FIGS. 4 and 5 are assigned the same reference numbers as those in FIGS. 4 and 5.

The main factors involved in destruction of the MISFET 5 are the gate electrode and gate insulating film constituting- the gate G. In the N-channel high-voltage MISFET 51 shown in FIGS. 10 and 11, therefore, a field oxide film 59 is used as the gate insulating layer 54 and, further, the gate electrode 50 is provided, as an aluminum or other metal wire, on an insulating layer 60 formed on the field oxide film 59.

This configuration markedly improves breakdown strength against noise-related noise fluctuations caused by static electricity superimposed on the voltage of the second power supply terminal 12.

SECOND EXAMPLE

Figure 12:
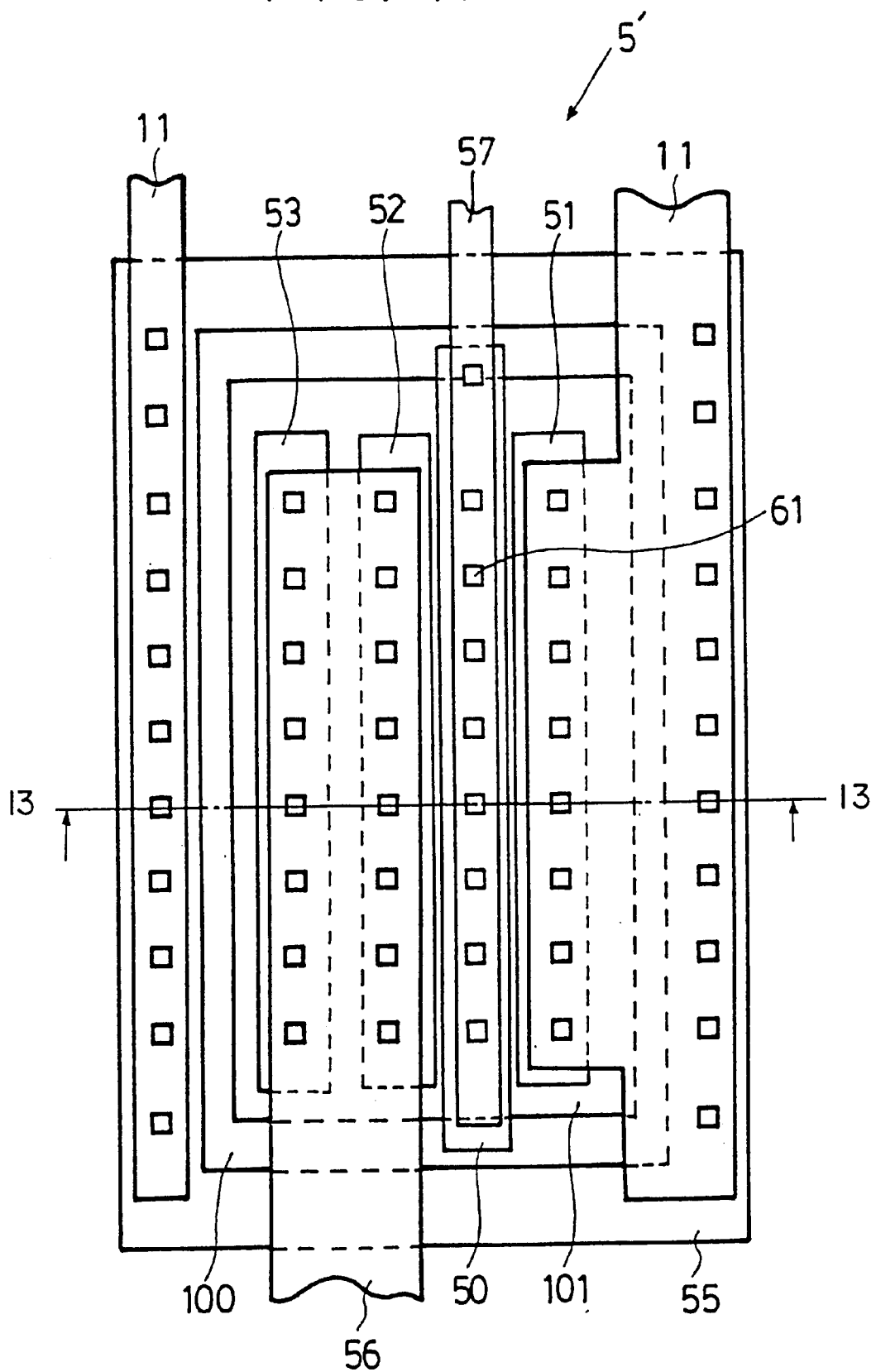
FIG. 12 is a plan view.
Figure 13:
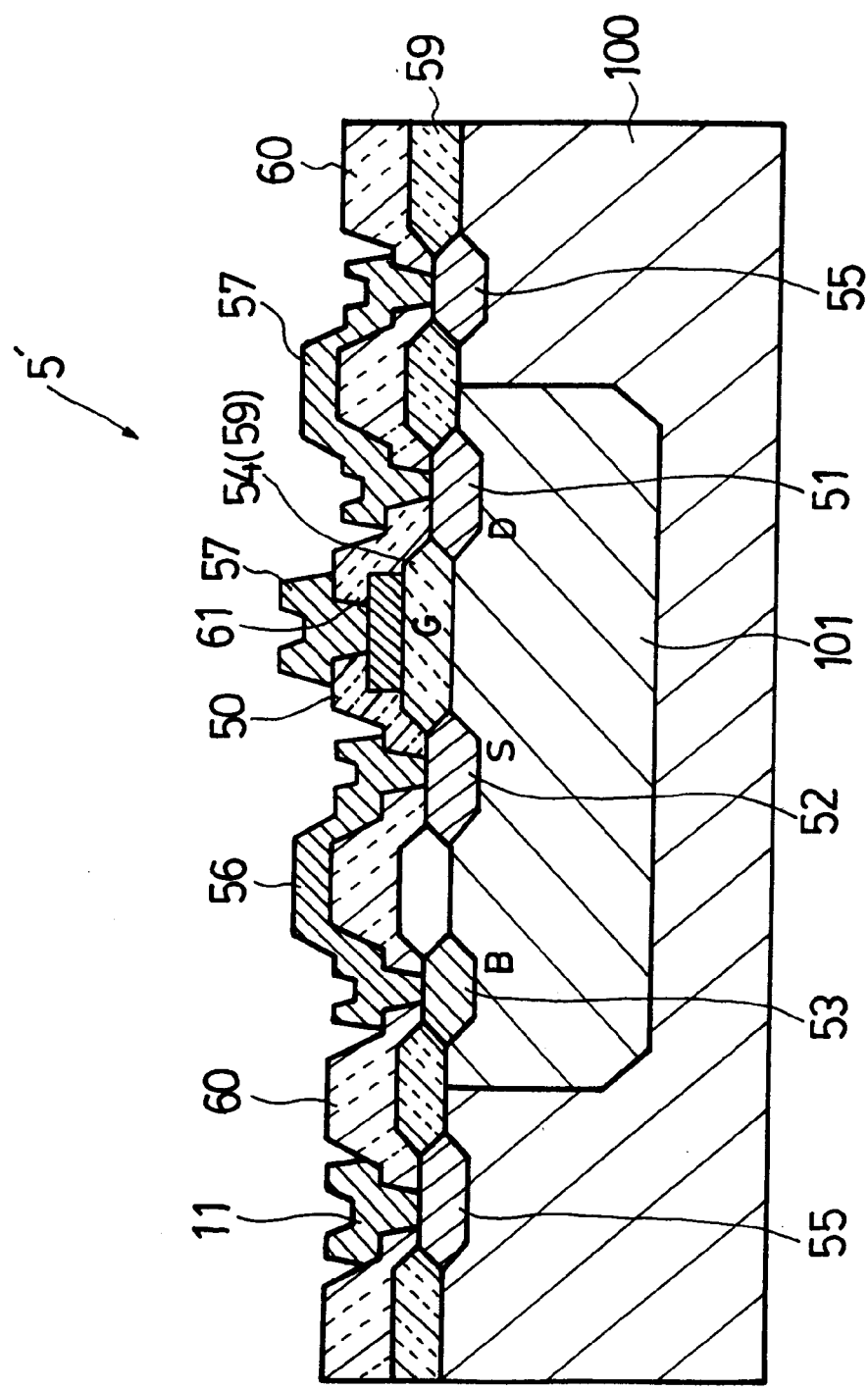
FIG. 13 is a sectional view taken along line 13—13 of the plan view showing a second example of the high-voltage MISFET 5' in FIG. 9.

FIG. 12 is a plan view and FIG. 13 is a sectional view similar to those of FIGS. 4 and 5 showing a second example of the N-channel high-voltage MISFET 5'. Portions that correspond to, but are not necessarily identical with, those of FIGS. 4 and 5 are assigned the same reference numbers as those in FIGS. 4 and 5.

In this example, as in the MISFET 5 shown in FIGS. 4 and 5, the gate electrode 50 is formed of polycrystalline silicon, and a field oxide film 59 is used as the gate insulating layer 54, a gate connection terminal 57 of aluminum wire is overlaid on the polycrystalline silicon gate electrode 50 over the whole length thereof, and numerous contact holes 61 are provided throughout the gate portion for connecting the gate electrode 50 and the gate connection terminal 57.

This configuration of the gate G of the high-voltage MISFET 5' improves its breakdown strength.

The gate electrode 50 can be made of aluminum instead of polycrystalline silicon. This increases the response speed and lowers the threshold voltage.

THIRD EXAMPLE

Figure 14:
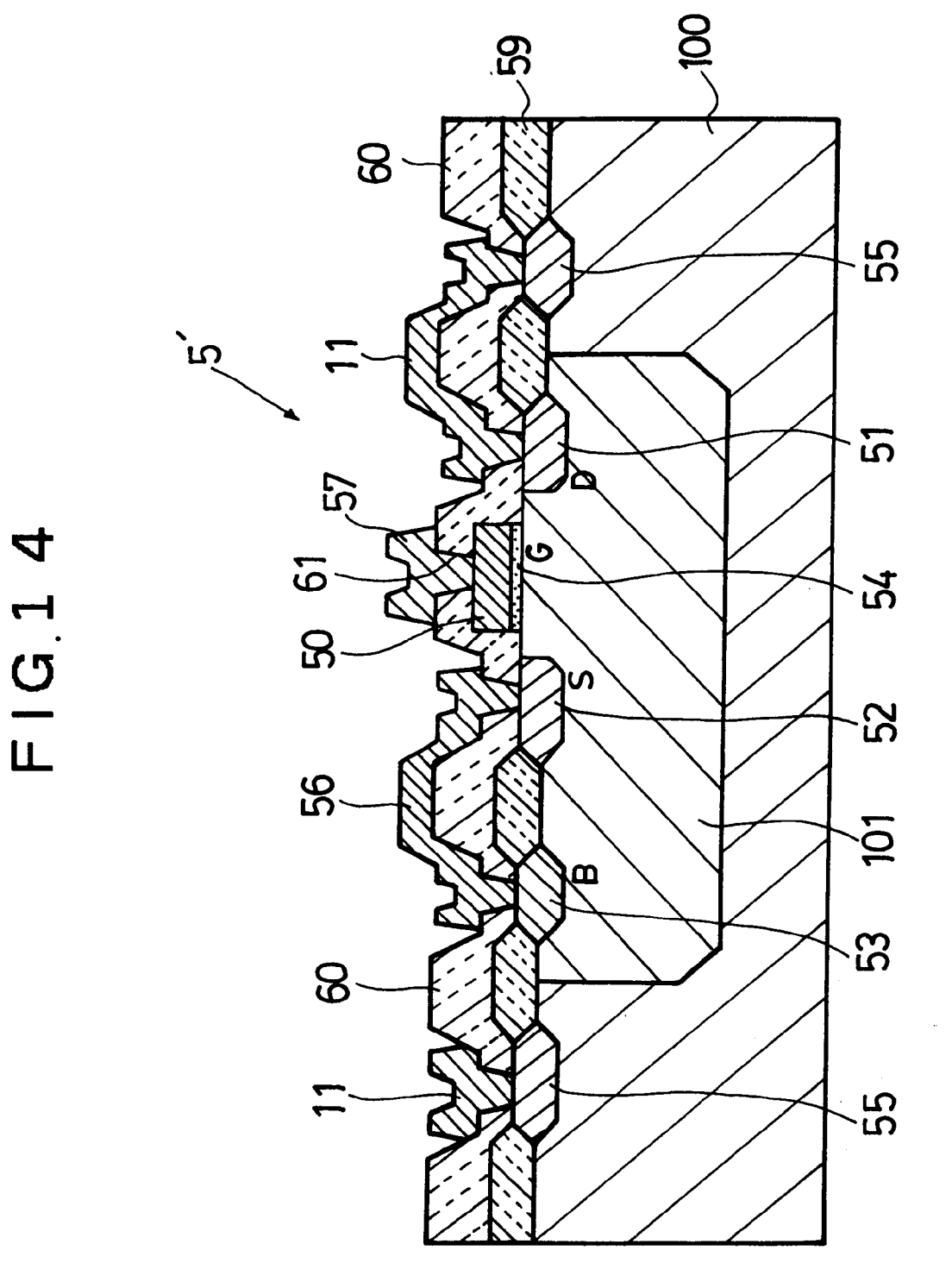

FIG. 14 is a sectional view similar to FIG. 13 showing a third example of the N-channel high-voltage MISFET 5'. Portions that correspond to, but are not necessarily identical with, those of FIG. 13 are assigned the same reference numbers as those in FIG. 13.

In this example, the gate electrode 50 is formed of polycrystalline silicon and the gate insulating layer 54 is a thin insulating film as in the N-channel MISFET 5 shown in FIG. 1. However, an offset gate structure is adopted in which the N-type diffused layer 52 forming the source S and the N-type diffused layer 51 forming the drain D are spaced from the gate electrode 50.

This configuration improves the breakdown strength of the gate insulating layer 54 of the gate G of the high-voltage MISFET 5'.

FOURTH EXAMPLE

Figure 15:
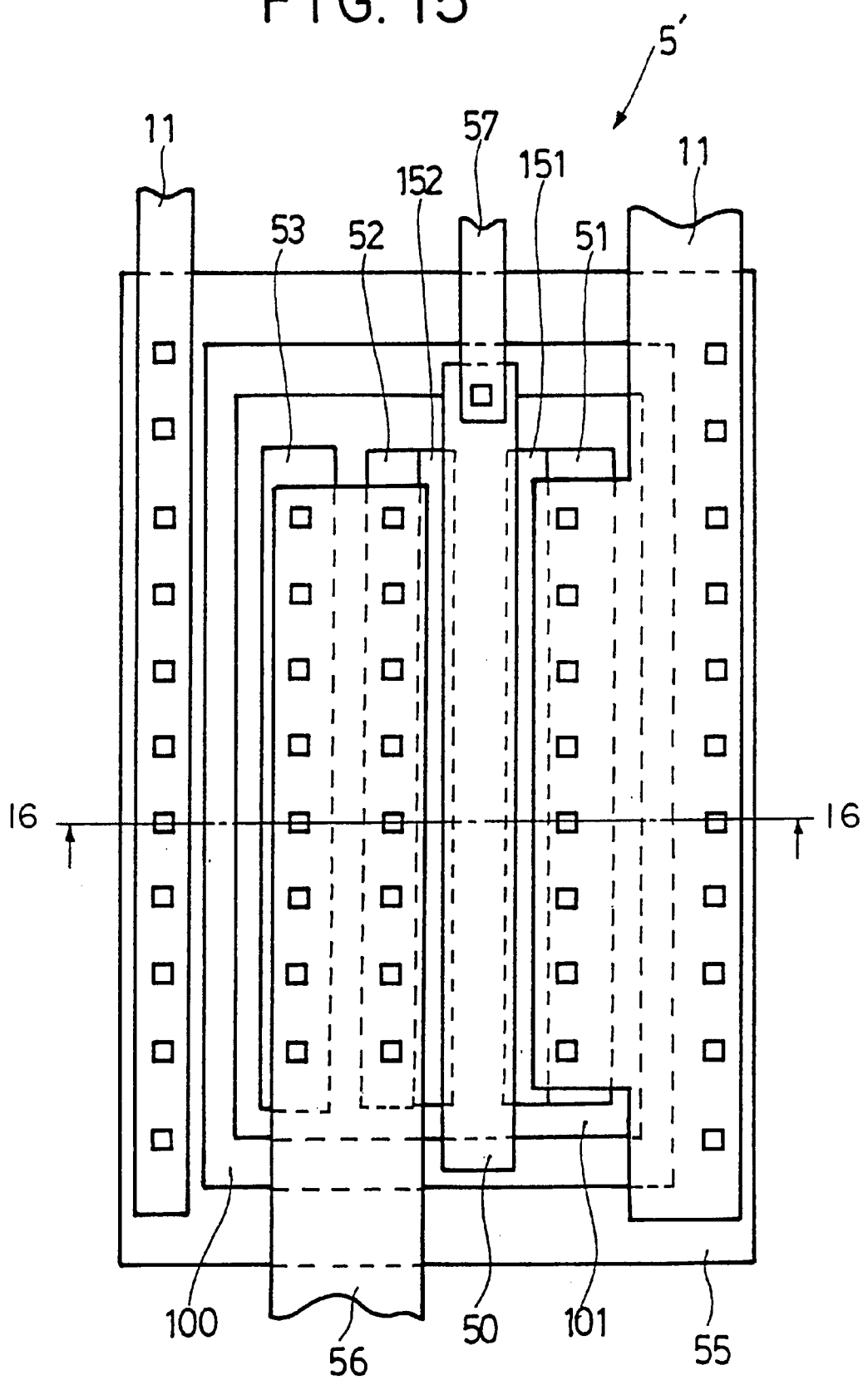
FIG. 15 is a plan view.
Figure 16:
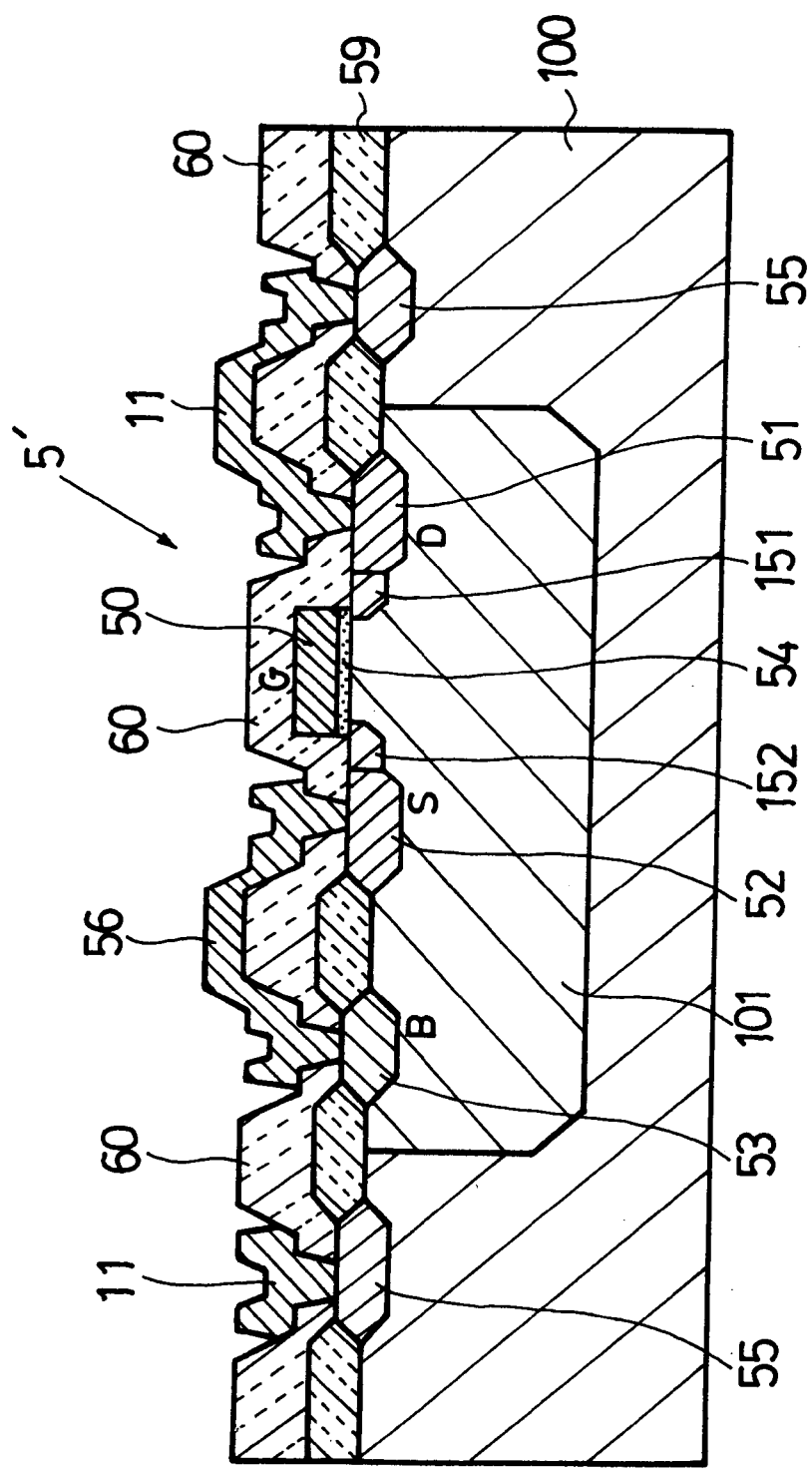
FIG. 16 is a sectional view taken along line 16—16 of the plan view showing a fourth example of the high-voltage MISFET 5' in FIG. 9.

FIG. 15 is a plan view and FIG. 16 is a sectional view similar to those of FIGS. 4 and 5 showing a fourth example of the N-channel high-voltage MISFET 5'. Portions that correspond to, but are not necessarily identical with, those of FIGS. 4 and 5 are assigned the same reference numbers as those in FIGS. 4 and 5.

In this example, too, the gate electrode 50 is formed of polycrystalline silicon and the gate insulating layer 54 is a thin insulating film as in the N-channel MISFET 5 shown in FIG. 1. However, a source LDD (lightly doped) region (thin impurity-diffused region) 152 is provided between the N-type diffused layer 52 forming the source S and gate electrode 50, and a drain LDD region 151 is provided between the N-type diffused layer 51 forming the drain D and the gate electrode 50.

This configuration also improves the breakdown strength of the gate insulating layer 54 of the gate G of the high-voltage MISFET 5'.

FIFTH EXAMPLE

Figure 17:
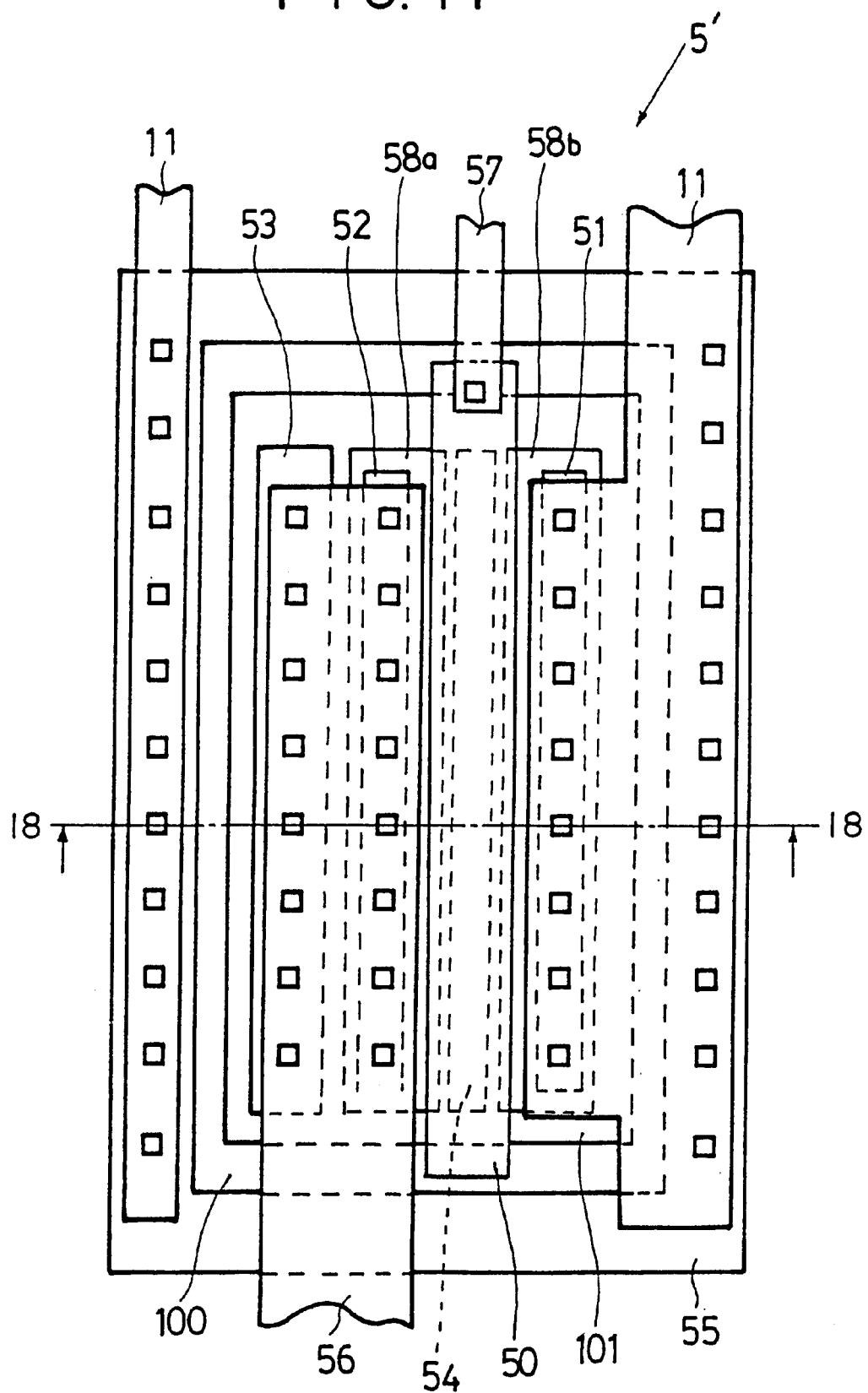
FIG. 17 is a plan view.
Figure 18:
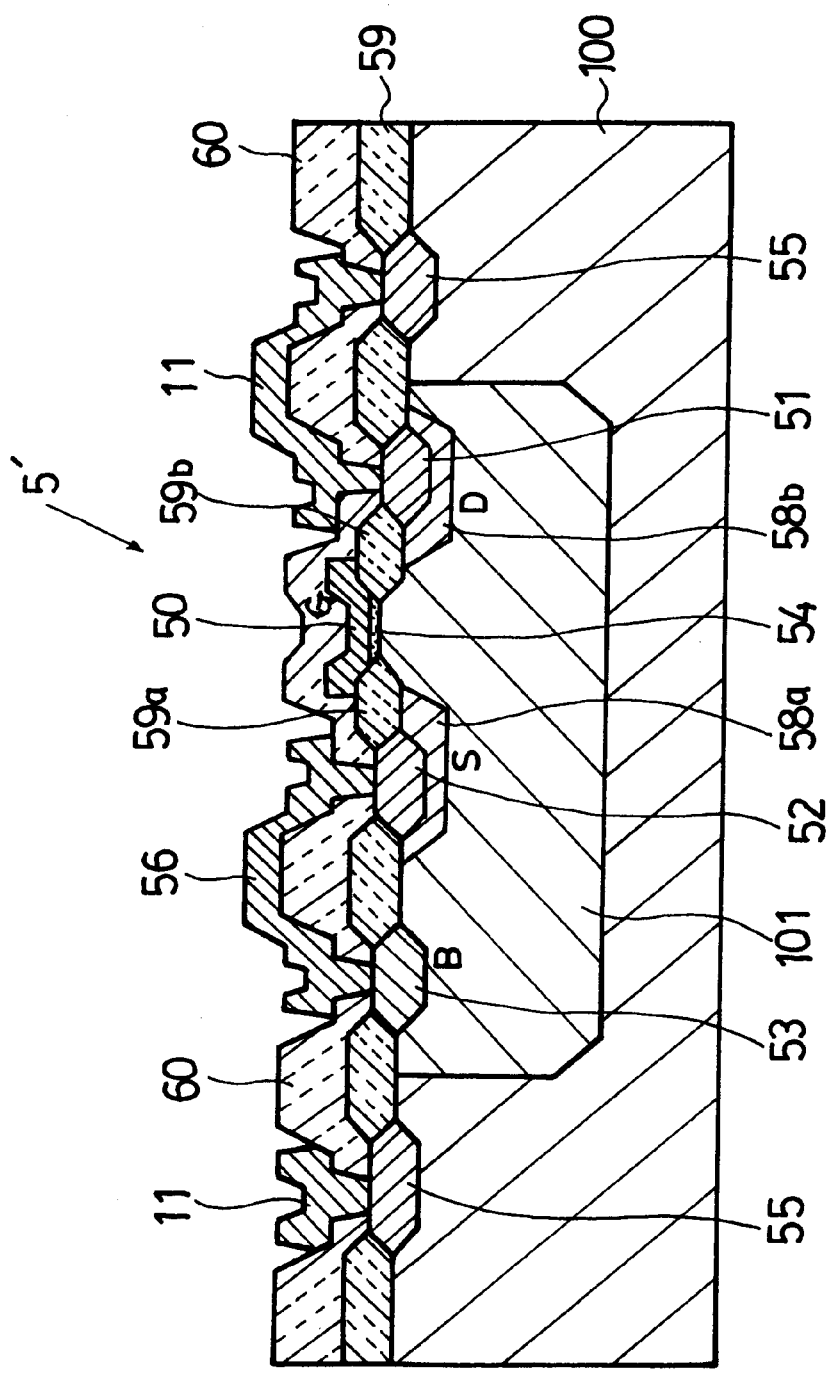
FIG. 18 is a sectional view taken along line 18—18 of the plan view showing a fifth example of the high-voltage MISFET 5' in FIG. 9.

FIG. 17 is a plan view and FIG. 18 is a sectional view similar to those of FIGS. 4 and 5 showing a fifth example of the N-channel high-voltage MISFET 5'. Portions that correspond to, but are not necessarily identical with, those of FIGS. 4 and 5 are assigned the same reference numbers as those in FIGS. 4 and 5.

In this high-voltage MISFET 5', the P-type well 101 is provided in the N-type semiconductor substrate 100, the gate insulating layer 54 is provided on the P-type well 101, and the gate electrode 50 is provided on the gate insulating layer 54.

An N-type diffused layer 52 forming the source S (hereinafter called the "source diffused layer") and an N-type diffused layer 51 forming the drain D (hereinafter called the "drain diffused layer") are provided on opposite sides of the gate electrode 50.

The source diffused layer 52 and the P-type diffused layer 53 forming the bulk terminal B are connected to the connection terminal 56. The drain diffused layer 51 is connected to the first power supply terminal 11, which also serves as the drain electrode.

Further, lightly doped diffusion layers 58a, 58b constituted as impurity-diffused layers whose impurity concentration is lower than the impurity concentration of the source diffused layer 52 and the drain diffused layer 51 are provided to enclose the source diffused layer 52 and the drain diffused layer 51, respectively. In addition, field oxide films 59a, 59b, which are field relaxation silicon oxide films of greater thickness than the gate insulating layer 54, are provided between the gate electrode 50 and the lightly doped diffusion layers 58a, 58b.

In other aspects the configuration is the same as that of the MISFET 5 shown in FIGS. 4 and 5.

In general, the withstand voltage of an MISFET is largely determined by the growth of the depletion layer produced at the PN junction between the drain region constituted as a high-concentration impurity-diffused layer and the semiconductor substrate. Growth of the depletion layer is particularly poor near the surface of the semiconductor substrate where the effect of the electric field of the gate electrode is large.

In order to improve the withstand voltage of the MISFET, therefore, it suffices to facilitate growth of the depletion layer at the PN junction. Since growth of the depletion layer improves generally with decreasing impurity concentration at the PN junction, it is a common practice to form an impurity-diffused layer of lower concentration than the drain region between the drain region and the semiconductor substrate.

In the high-voltage MISFET shown in FIGS. 17 and 18, the impurity concentration at the PN junction is lowered and ready depletion layer growth ensured by providing the lightly doped diffusion layers 58a, 58b, namely, impurity-diffused layers whose impurity concentration is lower than the impurity concentration of the source diffused layer 52 and the drain diffused layer 51, so as to enclose the source diffused layer 52 and the drain diffused layer 51, respectively.

As the gate insulating layer 54, it is preferable to use a silicon oxide film of a thickness of about 80 nm. The gate electrode 50 is made of polycrystalline silicon (polysilicon) of a thickness of around 450 nm. When the impurity used in the source diffused layer 52 is N type, use of phosphorous atoms is preferable; when it is P type, use of boron atoms is preferable. The field oxide film 59a formed at the end of the gate electrode 50 opposite the source diffused layer 52 is a silicon oxide film of a thickness of about 700 nm. When the impurity used in the lightly doped diffusion layers 58a, 58b is N type, use of phosphorous atoms is preferable; when it is P type, use of boron atoms is preferable.

When the impurity used in the drain diffused layer 51 is N type, use of phosphorous atoms is preferable; when it is P type, use of boron atoms is preferable.

This configuration also improves the breakdown strength of the gate insulating layer 54 of the gate G of the high-voltage MISFET 5'.

Figure 19:
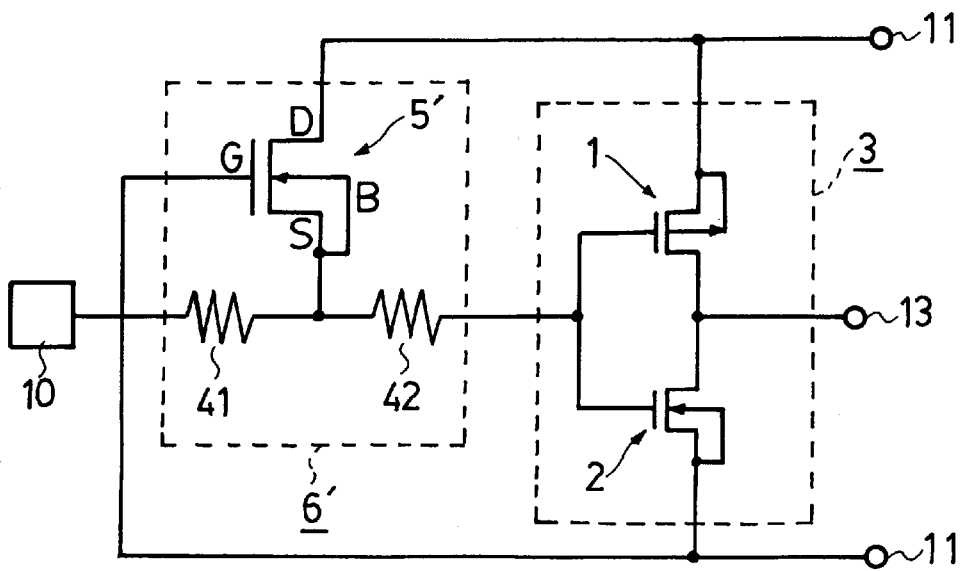
FIG. 19 is a circuit diagram showing a protection circuit for a semiconductor device which is a sixth embodiment of the invention and an internal circuit protected thereby.

Sixth Embodiment: FIG. 19

A sixth embodiment of the protection circuit for a semiconductor device according to the invention will now be explained with reference to FIG. 19. Portions in FIG. 19 which are identical with those in FIG. 9 are assigned the same reference symbols as those in FIG. 9.

The semiconductor device protection circuit shown in FIG. 19 differs from the semiconductor device protection circuit shown in FIG. 9 only in the point that the clamping circuit portion 6' is constituted of the N-channel high-voltage MISFET 5', a first resistor 41 and a second resistor 42.

The first resistor 41 is inserted between the pad 10 and the common connection terminal of the source S and bulk terminal B of the N-channel high-voltage MISFET 5', and the second resistor 42 is inserted between this common connection terminal and the gates of the P-channel MISFET 1 and the N-channel MISFET 2 of the internal circuit 3.

In other aspects the configuration is the same as that of the fifth embodiment of the invention semiconductor device protection circuit shown in FIG. 9.

In this sixth embodiment, the first resistor 41 and the second resistor 42 provided in the clamping circuit portion 6' function as current limiting elements and serve to protect the high-voltage MISFET 5' and the internal circuit 3.

Thus, a further improvement in protection capability, like that of the third embodiment of the semiconductor device protection circuit shown in FIG. 7, is achieved beyond that of the fifth embodiment of the semiconductor device protection circuit shown in FIG. 9.

Supplementary Explanation

While the structure and operation of first to sixth embodiments of the invention were explained in the foregoing, the invention is not limited to these embodiments.

In the first to fourth embodiments of the invention, the gate circuit resistor 15 of the gate circuit portion 8, and in the third, fourth and sixth embodiments thereof, the first resistor 41 and second resistor 42 of the clamping circuit portion 6 or 6' can be diffused resistances, thin-film resistances or a combination thereof.

In the case of a thin-film resistor, the material of the resistor is preferably a high-melting-point metal such as tungsten or titanium, polycrystalline silicon, a laminated body of polycrystalline silicon and a high-melting-point metal, or the like. Other materials for constituting the resistors can also be used as desired. The resistance values of these resistors can be freely selected within the range of values that do not limit the operating speed of the semiconductor device.

In the third embodiment of the semiconductor device protection circuit according to the invention shown in FIG. 7, for example, since the values selected for the first resistor 41 and second resistor 42 connected in series between the pad 10 and the internal circuit 3 greatly affect the transfer rate of signals input to the semiconductor device, the designer of the semiconductor device should preferably select the resistance values with consideration to the circuit operating speed.

A latch-up prevention effect is obtained by constituting the first resistor 41 as a thin-film resistor. The reason for this is as follows.

The latch-up phenomenon will be explained first. Parasitic bipolar transistors are structurally present in a semiconductor device using a MISFET. These bipolar transistors configure a thyristor circuit.

When the thyristor circuit is triggered by a static electricity-induced high-voltage, noise or the like from outside, the power supply current becomes excessively large. Once this excessive power supply current begins to flow, it continues to flow even if the cause of the thyristor circuit turn-on is removed.

Since the number of parasitic bipolar transistors that turn on and pass current is large, the power supply current increases to an excessive value that is several tens of times that of the power supply current during normal operation, which may cause fusion-breakage of the metal wiring or junction breakdown and, ultimately, destruction of the semiconductor device. This phenomenon is called "latch-up". The importance of implementing measures to prevent latch-up is high in semiconductor devices using MISFETs.

Figure 20:
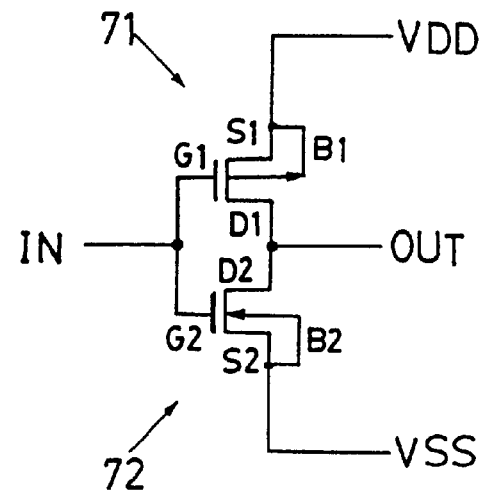
FIG. 20 is a diagram of an inverter circuit of a semiconductor device for explaining latch-up.

The latch-up mechanism will now be explained with reference to diagrams. FIG. 20 is a diagram of an inverter circuit of a semiconductor device for explaining latch-up, specifically a circuit diagram of a semiconductor device inverter circuit comprising a P-channel MISFET 71 and an N-channel MISFET 72.

In this inverter circuit, the gate GI of the P-channel MISFET 71 and the gate G2 of the N-channel MISFET 72 are connected to define an input terminal IN. The drain D1 of the P-channel MISFET 71 and the drain D2 of the N-channel MISFET 72 are connected to define an output terminal OUT. The source Si and the bulk terminal B1 of the P-channel MISFET 71 are connected to a first power supply VDD. The source S2 and the bulk terminal B2 of the N-channel MISFET 72 are connected to a second power supply VSS.

Figure 21:
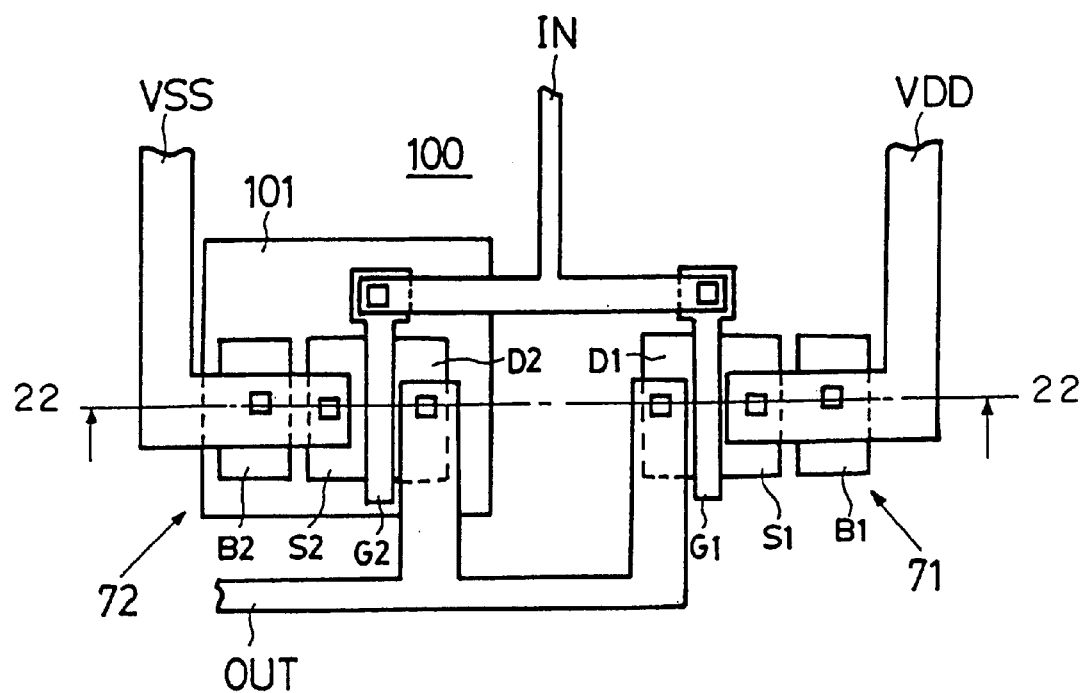
FIG. 21 is a semiconductor device plan view schematically illustrating the inverter circuit of FIG. 20.
Figure 22:
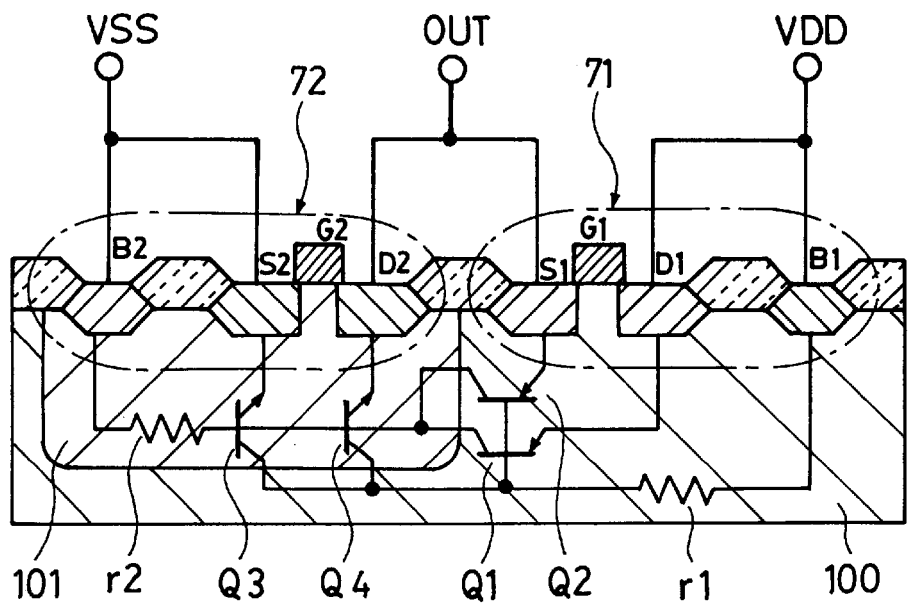
FIG. 22 is a sectional view taken along line 22—22 in FIG. 21, showing an equivalent circuit of a thyristor structure constituted by bipolar transistors parasitically present in the inverter.
Figure 23:
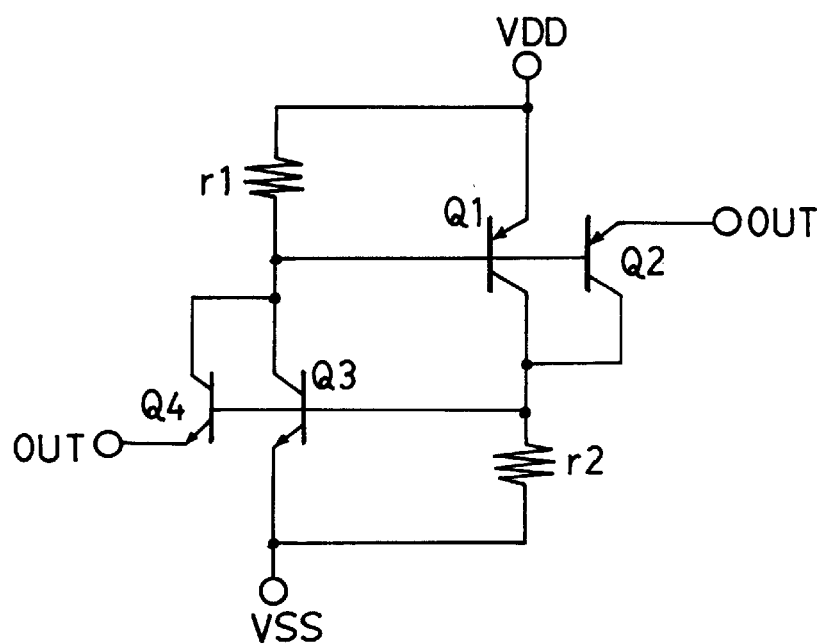
FIG. 23 is a diagram showing only the equivalent circuit.

FIG. 21 is a plan view schematically illustrating the inverter circuit of FIG. 20. FIG. 22 is a sectional view taken along line 22—22 in FIG. 21, showing an equivalent circuit of a thyristor configuration constituted by bipolar transistors parasitically present in the inverter. FIG. 23 is a diagram showing only the equivalent circuit.

The configuration of this semiconductor device will be explained mainly with reference to the sectional view of FIG. 22.

In this semiconductor device, the P-channel MISFET 71 is formed in an N-type semiconductor substrate 100 and the N-channel MISFET 72 is formed in a P-type well 101 formed in the N-type semiconductor substrate 100, thereby configuring an inverter circuit utilizing MISFETs.

Since the inverter circuit constituted of the P-channel MISFETs 71, 72 is formed with P- and N-type impurity diffused regions in the same semiconductor substrate 100, PNP bipolar transistors Q1, Q2 and NPN bipolar transistors Q3, Q4 are parasitically present. In addition, a resistor r1 and a resistor r2 are parasitically present in the N-type semiconductor substrate 100 and the P-type well 101, respectively.

The PNP bipolar transistor Q1 has the N-type semiconductor substrate 100 as its base, the source S1 of the P-channel MISFET 71 as its emitter, and the P-type well 101 as its collector. The PNP bipolar transistor Q2 has the N-type semiconductor substrate 100 as its base, the drain D1 of the P-channel MISFET 71 as its emitter, and the P-type well 101 as its collector.

Similarly, the NPN bipolar transistor Q3 has the P-type well 101 as its base, the source S2 of the N-channel MISFET 72 as its emitter, and the N-type semiconductor substrate 100 as its collector. The NPN bipolar transistor Q4 has the 2-type well 101 as its base, the drain D2 of the N-channel MISFET 72 as its emitter, and the N-type semiconductor substrate 100 as its collector.

This structure is characterized in that the collectors of the PNP bipolar transistors Q1, Q2 and the bases of the NPN bipolar transistors Q3, Q4 are constituted in common by the P-type well 101 and, similarly, the bases of the PNP bipolar transistors Q1, Q2 and the collectors of the NPN bipolar transistors Q3, Q4 are constituted in common by the N-type semiconductor substrate 100. The bipolar transistors Q1, Q2, Q3, Q4 and the resistors r1, r2 constitute a thyristor circuit.

The mechanism of latch-up occurrence will be explained with reference to the sectional view of FIG. 22 and the equivalent circuit of the thyristor structure of FIG. 23.

The case in which a static electricity-induced high-voltage, noise or the like is applied to the output terminal OUT from outside will be explained first.

When a voltage equal to or greater than the voltage of the first power supply VDD is applied to the output terminal OUT shown in FIG. 23, the drain DI of the P-channel MISFET 71 and the N-type semiconductor substrate 100 shown in FIG. 22 are forward-biased, so that current flows to the emitter and base of the PNP bipolar transistor Q2, making the emitter and collector conductive. As a result, current flows through the resistor r2, producing a voltage across the resistor r2.

The voltage developed across the resistor r2 is the base potential of the NPN bipolar transistor Q3. The rise of the base potential in the positive direction makes the emitter and collector of the NPN bipolar transistor Q3 conductive and the NPN bipolar transistor Q3 turn on.

When current flows through the NPN bipolar transistor Q3, a voltage is produced across the resistor r1, lowering the base potential of the PUP bipolar transistor Q1 and turning the PNP bipolar transistor Q1 on.

As a result, current flows through the emitter and base of the PNP bipolar transistor Q1 and the resistor r2, again producing a voltage across the resistor r2 and maintaining the NPN bipolar transistor Q3 in the ON state. Even if the voltage applied to the output terminal OUT is removed, excessive current continues to flow between the first power supply VDD and the second power supply VSS.

When a voltage equal to or less than the voltage of the first power supply VDD is applied to the output terminal OUT, the drain D2 of the N-channel MISFET 72 and the P-type well 101 are forward-biased, so that current flows to the base and emitter of the NPN bipolar transistor Q4, making the emitter and collector conductive. As a result, current flows through the resistor r1, producing a voltage across the resistor r1 and turning on the PNP bipolar transistor Q1.

A voltage is therefore produced across the resistor r2 and the NPN bipolar transistor Q3 turns on. As a result, a voltage is again produced across the resistor r1, maintaining the PNP bipolar transistor Q1 in the ON state. Even if the voltage applied to the output terminal OUT is removed, excessive current continues to flow between the first power supply VDD and the second power supply VSS.

In this state, as in case where a voltage equal to or greater than the voltage of the first power supply VDD is applied to the output terminal OUT, the collector currents of the NPN bipolar transistor Q3 and the PNP bipolar transistor Q1 supply each other with base currents, so that current continues to flow until the power supply voltage supplying current between the first power supply VDD and the second power supply VSS is cut off.

The foregoing mechanism is not the only one by which latch-up occurs. Many causes are conceivable. In every case, current flows to the N-type semiconductor substrate or P-type well formed with the MISFET and latch-up occurs when the voltage drop across the internal resistor r1 and resistor r2 exceeds a specific limit value.

As can be seen from the equivalent circuit of FIG. 23, the specific limit value is that when the voltage across the resistor r1 and resistor r2 becomes equal to the base-emitter voltage VEB of the PNP bipolar transistor Q1 and the NPN bipolar transistor Q3. This is one condition for occurrence of latch-up.

The cause of latch-up can be summarized as follows. When the bipolar transistors are turned on by excessive current flowing into the semiconductor substrate or well of the semiconductor device, specifically by carriers injected into the semiconductor substrate or well, the thyristor structure constituted by the bipolar transistors produces latch-up.

Numerous means are available for preventing latch-up. Since, as is clear from the foregoing explanation, latch-up is triggered by carriers injected into the semiconductor substrate or well, limiting the injection of carriers into the semiconductor substrate or well is an effective way to prevent latch-up.

A diffused resistor is constituted by selectively providing on the semiconductor substrate or the well an impurity-diffused layer of the opposite conductivity type from that of the semiconductor substrate or the well. A diode having a PN junction is therefore parasitically present in the diffused resistor.

On the other hand, a thin-film resistor is formed on a field oxide film or a insulating layer on the semiconductor substrate or the well. Therefore, no formation of a parasitic diode occurs as it does in the case of a diffused resistor.

In a prior-art semiconductor device protection circuit such as shown in FIG. 24, when a diffused resistor is used as the resistor 4, the parasitic diode in this diffused resistor is often used as the diodes 91, 92 as clamping elements. The reason for this is that it enables the resistor 4 serving as a current-limiting element and the diodes 91, 92 serving as voltage clamping elements to be built in as the same element, thereby reducing the space requirement of the protection circuit as a whole.

Aside from such a case of positive use of a diffused resistor as a resistor in a protection circuit, when a resistance component is required purely as a current limiting element, use is more commonly made of a thin-film resistor than of a diffused resistor which may trigger latch-up through injection of carriers into the semiconductor substrate or the well.

In the third, fourth and sixth embodiments of the invention therefore, since the first resistor 41 and the second resistor 42 included in the clamping circuit portion 6 or 6' are current-limiting resistances for limiting current flow to the N-channel MISFET 5 or the MISFET 5' serving as the clamping element and to the internal circuit 3, thereby protecting them from destruction, formation of these resistors as thin-film resistors enables securement of a latch-up prevention effect.

Specifically, when the first resistor 41 is constituted as a diffused resistor, the application of a positive or negative static electricity-induced high-voltage, noise or the like to the pad 10 produces current flow to the semiconductor substrate or the well through the diode parasitically present in the first resistor 41, thereby injecting carriers into the semiconductor substrate or the well and becoming a cause of latch-up.

When the first resistor 41 is constituted as a thin-film resistor, however, it can be used as a pure resistance with no carrier injection path to the semiconductor substrate or the well region, thereby making it possible to provide a protection circuit which prevents semiconductor device destruction and latch-up owing to static electricity-induced high-voltage, noise and the like.

The N-channel MISFET 5 (clamping element) explained regarding the first to fifth embodiments of the invention is provided with the P-type well 101 in the N-type semiconductor substrate 100 and in the P-type well 101 with the P-type diffused layer 53 forming the bulk terminal B of the N-channel MISFET 5, the N-type diffused layer 52 forming the source S thereof, and the N-type diffused layer 51 forming the drain D thereof.

A protection circuit having the characteristics of this invention can, however, also be provided without the P-type well 101 by providing diffusion layers in a P-type semiconductor substrate 100 to form the bulk terminal B, the source S and the drain D of the N-channel MISFET.

In either case, various modification can be made without departing from the spirit of the invention. It is also possible to adopt a configuration combining the prior-art protection circuit 9 shown in FIG. 24 and the protection circuit of this invention. Specifically, the protection circuit of this invention can be provided between the protection circuit 9 and the internal circuit shown in FIG. 24 or between the protection circuit 9 and the pad 10 shown therein.

What is claimed is:

1. A protection circuit for a semiconductor device comprising:

at least one clamping circuit portion provided between at least one pad and at least internal circuit of a semiconductor device; and at least one gate circuit portion connected to the clamping circuit portion, the clamping circuit portion including a MIS field effect transistor, the gate circuit portion including a gate circuit resistor and a capacitor, and the MIS field effect transistor of the clamping circuit portion having:

a source terminal and a bulk terminal being connected to the pad and the internal circuit;

a drain terminal being connected to a first power supply terminal;

a gate terminal being connected to one terminal of the gate circuit resistor and one terminal of the capacitor of the gate circuit portion, another terminal of the gate circuit resistor being connected to a second power supply terminal, and another terminal of the capacitor being connected to the first power supply terminal.

2. A protection circuit for a semiconductor device according to claim 1, wherein the semiconductor device includes multiple pads and multiple internal circuits which send/receive electrical signals through the pads, the clamping circuit portion being provided between each pad and the associated internal circuit, and the gates of the MIS field effect transistors of the clamping circuit portions being connected to the one terminal of the gate circuit resistor and the one terminal of the capacitor of the gate circuit portion.

3. A protection circuit for a semiconductor device according to claim 2, wherein each of the plurality of clamping circuit portions includes a first resistor between the pad and the source and bulk terminals of the MIS field effect transistor and a second resistor between the source and bulk terminals of the MIS field effect transistor and the internal circuit.

4. A protection circuit for a semiconductor device according to claim 3, wherein at least the first resistor is constituted as a thin film resistor.

5. A protection circuit for a semiconductor device according to claim 1, wherein the clamping circuit portion includes a first resistor between the pad and the source and bulk terminals of the MIS field effect transistor and a second resistor between the source and bulk terminals of the MIS field effect transistor and the internal circuit.

6. A protection circuit for a semiconductor device according to claim 5, wherein at least the first resistor is constituted as a thin film resistor.

* * * * *